United States Patent
Jinbo

(10) Patent No.: US 8,110,442 B2
(45) Date of Patent: Feb. 7, 2012

(54) METHOD OF MANUFACTURING SEMICONDUCTOR DEVICE

(75) Inventor: Yasuhiro Jinbo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1236 days.

(21) Appl. No.: 11/819,027

(22) Filed: Jun. 25, 2007

(65) Prior Publication Data

US 2008/0003727 A1    Jan. 3, 2008

(30) Foreign Application Priority Data

Jun. 30, 2006    (JP) .................................. 2006-182779

(51) Int. Cl.
*H01L 21/78* (2006.01)

(52) U.S. Cl. .......... 438/114; 438/67; 438/462; 438/660; 438/690

(58) Field of Classification Search ........................ None
See application file for complete search history.

(56) References Cited

U.S. PATENT DOCUMENTS

| | | | |
|---|---|---|---|
| 5,821,138 A | 10/1998 | Yamazaki et al. |
| 5,834,327 A | 11/1998 | Yamazaki et al. |
| 6,100,166 A | 8/2000 | Sakaguchi et al. |
| 6,127,199 A | 10/2000 | Inoue et al. |
| 6,376,333 B1 | 4/2002 | Yamazaki et al. |
| 6,521,511 B1 | 2/2003 | Inoue et al. |
| 6,627,518 B1 | 9/2003 | Inoue et al. |
| 6,682,963 B2 | 1/2004 | Ishikawa |
| 6,814,832 B2 | 11/2004 | Utsunomiya |
| 6,849,877 B2 | 2/2005 | Yamazaki et al. |
| 6,866,949 B2 | 3/2005 | Ota et al. |
| 6,998,282 B1 | 2/2006 | Yamazaki et al. |
| 7,067,392 B2 | 6/2006 | Yamazaki et al. |
| 7,084,045 B2 | 8/2006 | Takayama et al. |
| 7,147,740 B2 | 12/2006 | Takayama et al. |
| 7,169,652 B2 | 1/2007 | Kimura |
| 7,189,631 B2 | 3/2007 | Yamazaki et al. |
| 7,252,923 B2 | 8/2007 | Kobayashi |
| 7,273,773 B2 | 9/2007 | Yamazaki et al. |
| 7,341,924 B2 | 3/2008 | Takayama et al. |

(Continued)

FOREIGN PATENT DOCUMENTS

JP    07-157727    6/1995

(Continued)

*Primary Examiner* — Zandra Smith
*Assistant Examiner* — Pamela E Perkins
(74) *Attorney, Agent, or Firm* — Eric J. Robinson; Robinson Intellectual Property Law Office, P.C.

(57) ABSTRACT

A method of manufacturing a thin TFT over a flexible substrate is provided. In formation of a TFT on a surface of a substrate having heat resistance, a liquid repellent film is formed selectively on a surface of the substrate, and an organic film is formed thereover. An element such as a TFT is formed over the organic film. Since the liquid repellent film is formed over the substrate, adhesion between the substrate and the organic film is low; therefore, the element which is formed can be peeled off from the substrate easily. Further, since the element is not transferred to another substrate, a semiconductor device which is thinner than conventional ones can be manufactured. In order to form the liquid repellent film selectively, light exposure of a front surface or a back surface of the substrate provided with a mask, a droplet discharging method, or the like is used.

57 Claims, 13 Drawing Sheets

U.S. PATENT DOCUMENTS

| | | | |
|---|---|---|---|
| 7,572,718 B2 * | 8/2009 | Kanno et al. | 438/585 |
| 7,575,965 B2 | 8/2009 | Kuwabara et al. | |
| 7,632,721 B2 | 12/2009 | Yamazaki et al. | |
| 7,632,740 B2 | 12/2009 | Aoki et al. | |
| 7,666,722 B2 * | 2/2010 | Koyama | 438/155 |
| 7,713,836 B2 | 5/2010 | Aoki et al. | |
| 7,820,465 B2 | 10/2010 | Fujii | |
| 7,820,529 B2 | 10/2010 | Tsurume et al. | |
| 2003/0024635 A1 * | 2/2003 | Utsunomiya | 156/272.2 |
| 2004/0129960 A1 | 7/2004 | Maruyama et al. | |
| 2007/0111391 A1 | 5/2007 | Aoki et al. | |
| 2007/0207571 A1 | 9/2007 | Morisue et al. | |
| 2007/0295973 A1 | 12/2007 | Jinbo et al. | |
| 2008/0044940 A1 * | 2/2008 | Watanabe et al. | 438/64 |

FOREIGN PATENT DOCUMENTS

| | | |
|---|---|---|
| JP | 2003-098977 | 4/2003 |
| JP | 2003-136628 | 5/2003 |
| JP | 2004-153021 | 5/2004 |
| JP | 2006-100662 | 4/2006 |

* cited by examiner

METHOD OF MANUFACTURING SEMICONDUCTOR DEVICE

BACKGROUND OF THE INVENTION

1. Field of the Invention

The present invention relates to a method of manufacturing a semiconductor device. In particular, the present invention relates to a method of manufacturing a semiconductor device which is formed over a flexible substrate.

2. Description of the Related Art

In recent years, a technology for semiconductor devices having thin film transistors (hereinafter referred to as TFTs) including semiconductor films formed over insulating substrates has been developed extensively. TFTs are widely used as switching element for operation of a display element, an IC tag, and the like.

A glass substrate, a quartz substrate, and the like have been heretofore used as a substrate for forming TFTs. These substrates have disadvantages in that they are easily broken and are heavy. Therefore, in recent years, a flexible substrate attracts attention in particular. A flexible substrate is thin, light weight, and bendable; therefore, it allows various designs and can be easily formed into flexible shapes. In addition, a flexible substrate is excellent in impact resistance, and can be easily attached or embedded in various goods; accordingly, the flexible substrate can be useful in variety of fields. A plastic substrate can be given as a typical example of a flexible substrate.

Since a manufacturing process of a TFT needs high temperature, in the case of using a plastic substrate, it is necessary to use a plastic having heat resistance which withstands a processing temperature in the manufacturing process. A technique for forming a TFT over a plastic substrate using a low temperature film forming apparatus or laser annealing is disclosed in Patent Document 1 (Patent Document 1: Japanese Published Patent Application No. 2006-100662).

However, in general, a following method (a method including a peeling step and a transferring step) is used: a TFT is provided over a substrate formed of glass, the TFT is peeled off, and the TFT which is peeled off is provided over a substrate formed of a plastic. As a flexible substrate, a film of polyethylene naphthalate (PEN) can be used specifically. A film of poly ethylene terephthalate (PET), a polybutylene naphthalate (PBN), polyimide (PO), polyamnide (PA), or the like may be used as well as a film of polyethylene naphthalate. A technique for forming a TFT over a plastic substrate through a transferring step is disclosed, for example, in Patent Document 2 (Patent Document 2: Japanese Published Patent Application No. 2004-153021).

SUMMARY OF THE INVENTION

However, it is not preferable that a TFT is manufactured over a glass substrate and then transferred to a plastic substrate through a peeling step and a transferring step, because the TFT and a peripheral element may be influenced mechanically and damaged in a step of peeling off the TFT from the glass substrate, or transferring the TFT, which is peeled, to the plastic substrate. Further, there is a possibility that static electricity is generated in these steps and the generated static electricity damages the TFT and the peripheral element, which may lead to significant reduction in yields.

On the other hand, in a case of manufacturing a TFT over a plastic substrate without peeling and transferring steps, there are much restriction on apparatuses, conditions, and the like, compared with a case of manufacturing a TFT over a glass substrate and then transferring the TFT to the plastic substrate through the peeling and transferring steps.

In general, a plastic substrate has low heat resistance; therefore, it is necessary to keep the plastic substrate under low temperature compared with a case of using a glass substrate. For example, there is restriction such that a desired part of a plastic substrate needs to be heated locally with a laser when a TFT is formed over the plastic substrate, whereas a substrate is heated when a TFT is formed over a glass substrate.

In addition, since a plastic substrate is flexible, alignment in pattern formation is less precise than a case of using a glass substrate. Therefore, yields may be decreased.

In view of the foregoing, the present invention provides a method of manufacturing a semiconductor device which is manufactured by peeling an element group which is formed over a glass substrate and transferring the element group to a plastic substrate. In specific, a liquid repellent film is formed over a substrate, a base film is formed over the liquid repellent film, an element group is formed over the base film, and the element group which is formed is peeled off. Since adhesion between the liquid repellent film and the base film is low, the peeling is easily conducted. Further, a region other than a region in which the element group to be peeled is formed is not provided with the liquid repellent film (a non-liquid repellent region), whereby undesired peeling can be prevented. Formation of a liquid repellent region and a non-liquid repellent region is conducted by light exposure.

One aspect of the present invention is a method of manufacturing a semiconductor device, which includes forming a liquid repellent film over a substrate having heat resistance, forming a mask in a first region over the liquid repellent film, forming a second region by exposing a region in which the mask is not formed to light, removing the mask, forming a base film over the substrate having the first region and the second region, forming a semiconductor element group including TFTs in a region overlapping with the first region over the base film, forming a region surrounded by a groove by forming the groove so as to surround a region in which the semiconductor element group is formed, and peeling off the region surrounded by the groove from the substrate.

One aspect of the present invention is a method of manufacturing a semiconductor device, which includes forming a mask selectively over a light-transmitting substrate having heat resistance, forming a first region by forming a liquid repellent film over the substrate and the mask, exposing a back surface of the substrate to light, forming a second region by exposing a region in which the mask is not formed to light, forming a base film over the substrate having the first region and the second region, forming a semiconductor element group including TFTs in a region overlapping with the first region over the base film, forming a region surrounded by a groove by forming the groove so as to surround a region in which the semiconductor element group is formed, and peeling off the region surrounded by the groove from the substrate.

One aspect of the present invention is a method of manufacturing a semiconductor device, which includes forming a mask selectively over a light-transmitting substrate having heat resistance, forming a photocatalyst film over the substrate and the mask, forming a first region by forming a liquid repellent film over the photocatalyst film, exposing a back surface of the substrate to light, forming a second region by exposing a region in which the mask is not formed to light, forming a base film over the substrate having the first region and the second region, forming a semiconductor element group including TFTs in a region overlapping with the first region over the base film, forming a region surrounded by a groove by forming the groove so as to surround a region in which the semiconductor element group is formed, and peeling off the region surrounded by the groove from the substrate.

One aspect of the present invention is a method of manufacturing a semiconductor device, which includes forming a mask selectively over a light-transmitting substrate having heat resistance, forming a first region by forming a liquid repellent film overt the substrate and the mask, forming a photocatalyst film over the liquid repellent film, exposing a back surface of the substrate to light, forming a second region by exposing a region in which the mask is not formed to light, forming a base film over the substrate having the first region and the second region, forming a semiconductor element group including TFTs in a region overlapping with the first region over the base film, forming a region surrounded by a groove by forming the groove so as to surround a region in which the semiconductor element group is formed, and peeling off the region surrounded by the groove from the substrate.

One aspect of the present invention is a method of manufacturing a semiconductor device, which includes forming a mask selectively over a substrate having heat resistance, forming a liquid repellent film over the mask, forming a first region in which the mask is formed and a second region in which the mask is not formed, forming a base film over the substrate having the first region and the second region, forming a semiconductor element group including TFTs in a region overlapping with the first region over the base film, forming a region surrounded by a groove by forming the groove so as to surround a region in which the semiconductor element group is formed, and peeling off the region surrounded by the groove from the substrate.

One aspect of the present invention is a method of manufacturing a semiconductor device, which includes forming a liquid repellent film selectively over a substrate having heat resistance, forming a first region in which the liquid repellent film is formed and a second region in which the liquid repellent film is not formed, forming a base film over the substrate having the first region and the second region, forming a semiconductor element group including TFTs in a region overlapping with the first region over the base film, forming a region surrounded by a groove by forming the groove so as to surround a region in which the semiconductor element group is formed, and peeling off the region surrounded by the groove from the substrate.

One aspect of the present invention is a method of manufacturing a semiconductor device, which includes forming a pattern over a substrate having heat resistance, forming a liquid repellent film over a substrate having the pattern, forming a mask in a first region over the liquid repellent film, forming a second region by exposing a region in which the mask is not formed to light, removing the mask, forming a base film over the substrate having the first region and the second region, forming a semiconductor element group including TFTs in a region overlapping with the first region over the base film, forming a region surrounded by a groove by forming the groove so as to surround a region in which the semiconductor element group is formed, and peeling off the region surrounded by the groove from the substrate.

One aspect of the present invention is a method of manufacturing a semiconductor device, which includes forming a mask selectively over a light-transmitting substrate having heat resistance, forming a pattern over the mask, forming a first region by forming a liquid repellent film over the substrate and the mask having the pattern, exposing a back surface of the substrate to light, forming a second region by exposing a region in which the mask is not formed to light, forming a base film over the substrate having the first region and the second region, forming a semiconductor element group including TFTs in a region overlapping with the first region over the base film, forming a region surrounded by a groove by forming the groove so as to surround a region in which the semiconductor element group is formed, and peeling off the region surrounded by the groove from the substrate.

One aspect of the present invention is a method of manufacturing a semiconductor device, which includes forming a mask selectively over a light-transmitting substrate having heat resistance, forming a pattern over the mask, forming a photocatalyst film over the substrate and the mask having the pattern, forming a first region by forming a liquid repellent film over the photocatalyst film, exposing a back surface of the substrate to light, forming a second region by exposing a region in which the mask is not formed to light, forming a base film over the substrate having the first region and the second region, forming a semiconductor element group including TFTs in a region overlapping with the first region over the base film, forming a region surrounded by a groove by forming the groove so as to surround a region in which the semiconductor element group is formed, and peeling off the region surrounded by the groove from the substrate.

One aspect of the present invention is a method of manufacturing a semiconductor device, which includes forming a mask selectively over a light-transmitting substrate having heat resistance, forming a pattern over the mask, forming a first region by forming a liquid repellent film over the substrate and the mask having the pattern, forming a photocatalyst film over the liquid repellent film, exposing a back surface of the substrate to light, forming a second region by exposing a region in which the mask is not formed to light, forming a base film over the substrate having the first region and the second region, forming a semiconductor element group including TFTs in a region overlapping with the first region over the base film, forming a region surrounded by a groove by forming the groove so as to surround a region in which the semiconductor element group is formed, and peeling off the region surrounded by the groove from the substrate.

One aspect of the present invention is a method of manufacturing a semiconductor device, which includes forming a mask selectively over a substrate having heat resistance, forming a pattern over the mask, forming a liquid repellent film over the mask having the pattern, forming a first region in which the mask is formed and a second region in which the mask is not formed, forming a base film over the substrate having the first region and the second region, forming a semiconductor element group including TFTs in a region overlapping with the first region over the base film, forming a region surrounded by a groove by forming the groove so as to surround a region in which the semiconductor element group is formed, and peeling off the region surrounded by the groove from the substrate.

One aspect of the present invention is a method of manufacturing a semiconductor device, which includes forming a pattern over a substrate having heat resistance, forming a liquid repellent film selectively over the substrate having the pattern, forming a first region in which the liquid repellent film is formed and a second region in which the liquid repellent film is not formed, forming a base film over the substrate having the first region and the second region, forming a semiconductor element group including TFTs in a region overlapping with the first region over the base film, forming a region surrounded by a groove by forming the groove so as to surround a region in which the semiconductor element group is formed, and peeling off the region surrounded by the groove from the substrate.

In the present invention having the foregoing structure, the liquid repellent film is preferably formed of a silane coupling agent having a fluoroalkyl group.

In the present invention having the foregoing structure, the liquid repellent film may be formed using a chemical solution containing a mercapto group. When a chemical solution containing a mercapto group is used for the liquid repellent film, the mask preferably has, as its main component, one or a plurality of elements selected from gold (Au), silver (Ag), platinum (Pt), copper (Cu), palladium (Pd), rhodium (Rh), and ruthenium (Ru), or an alloy containing any of these elements.

In the present invention having the foregoing structure, the substrate having heat resistance may be a glass substrate, a quartz substrate, a silicon substrate, an aluminum oxide substrate, or a titanium oxide substrate.

In the present invention having the foregoing structure, the light-transmitting substrate having heat resistance may be a glass substrate or a quartz substrate.

In the present invention having the foregoing structure, the photocatalyst film is preferably a titanium oxide film.

In the present invention having the foregoing structure, a film formed of an insulating organic material is preferably used as the base film.

In the present invention having the foregoing structure, a film containing one or a plurality of elements selected from an epoxy resin, an acrylic resin, and polyimide as its main component is preferably used as the base film.

In the present invention having the foregoing structure, a film formed of an insulating inorganic material may be used as the base film.

In the present invention having the foregoing structure, laser light may be used for forming the groove.

In the present invention having the foregoing structure, a temperature during all manufacturing steps is preferably less than or equal to 300° C.

Note that, in the present invention, a semiconductor device generally corresponds to a device which functions by utilizing semiconductor characteristics.

Note that various modes can be applied to a display element. For example, a display medium whose contrast is varied by an electromagnetic action can be used as a display element, such as an EL element (an organic EL element, an inorganic EL element, or an EL element containing an organic substance and an inorganic substance), an electron emitting element, a liquid crystal element, electron ink, a grating light valve (GLV), a plasma display panel (PDP), a digital micromirror device (DMD), a piezoceramic display device, or a carbon nanotube. An example of a display device using an EL element is an EL display. Examples of a display device using an electron emitting element are a field emission display (FED), an SED flat-panel display (SED: Surface-conduction Electron-emitter Display), and the like. An example of a display device using a liquid crystal element is a liquid crystal display. An example of a display device using electronic ink is electronic paper.

According to the present invention, the possibility that an element group is influenced mechanically and electrostatically and damaged in peeling and transferring steps can be reduced. Accordingly, a TFT can be manufactured over a flexible substrate with high yield.

In the present invention, a TFT is manufactured over a substrate having heat resistance; therefore, alignment in pattern formation can be precise compared to a case in which a TFT is formed directly over a plastic substrate. Further, a TFT can be manufactured over a flexible substrate with high yield, without significant restriction on apparatuses, conditions, and the like.

Furthermore, by using the present invention, a semiconductor device itself can be thin compared with a conventional manufacturing method, in which a TFT is transferred to a plastic substrate.

DETAILED DESCRIPTION OF THE INVENTION

Hereinafter, embodiment modes of the present invention are described with reference to the accompanying drawings. The present invention can be carried out in many different modes, and it is easily understood by those skilled in the art that modes and details can be modified in various ways without departing from the purpose and the scope of the present invention. Accordingly, the present invention should not be interpreted as being limited to the description of the embodiment modes.

Embodiment Mode 1

Figure 2A:
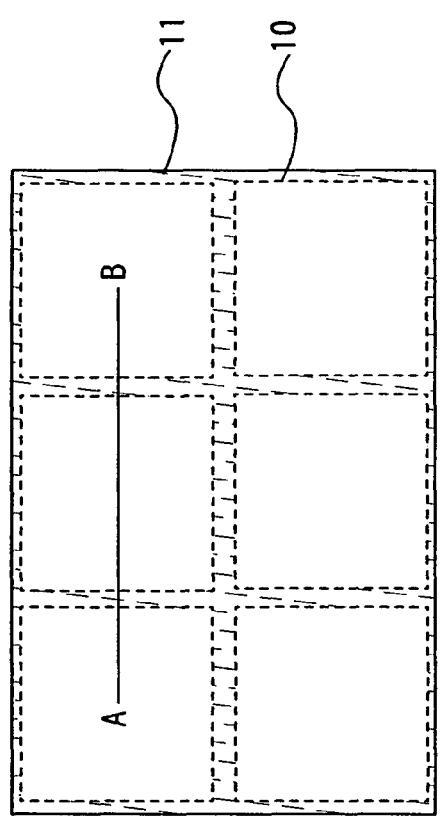
FIGS. 2A and 2B show a method of manufacturing a semiconductor device of the present invention.
Figure 2B:
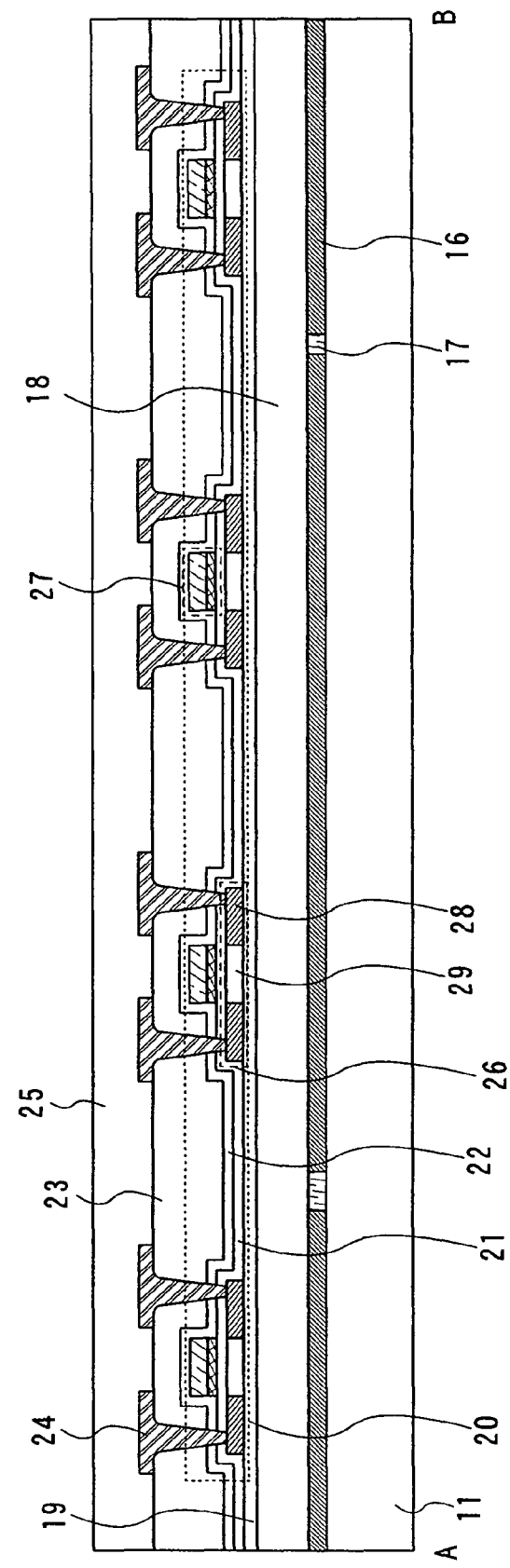
Figure 3A:
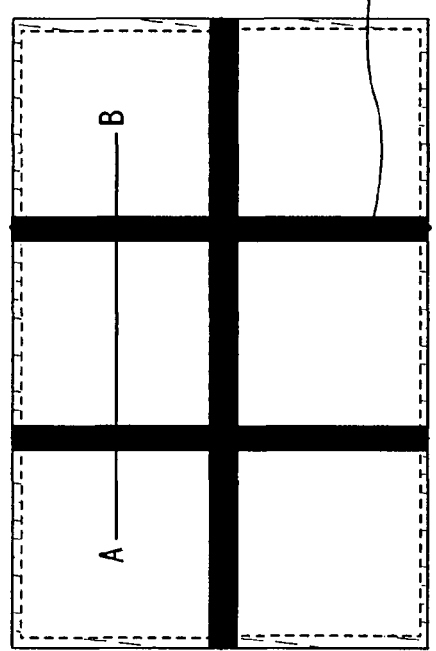
FIGS. 3A and 3B show a method of manufacturing a semiconductor device of the present invention.
Figure 3B:
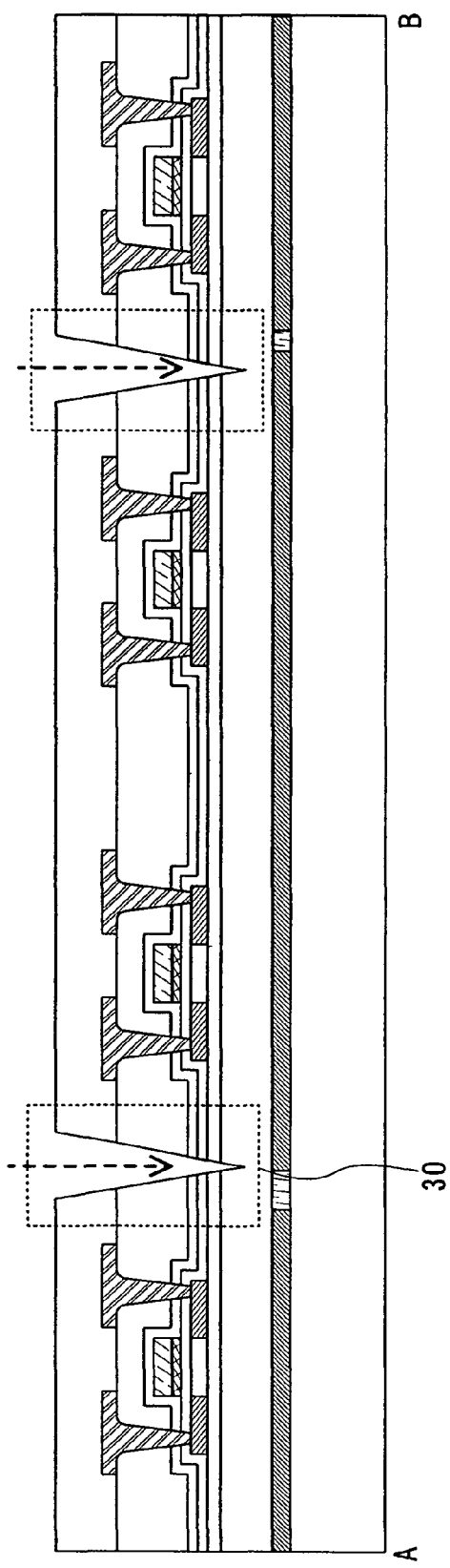
Figure 4A:
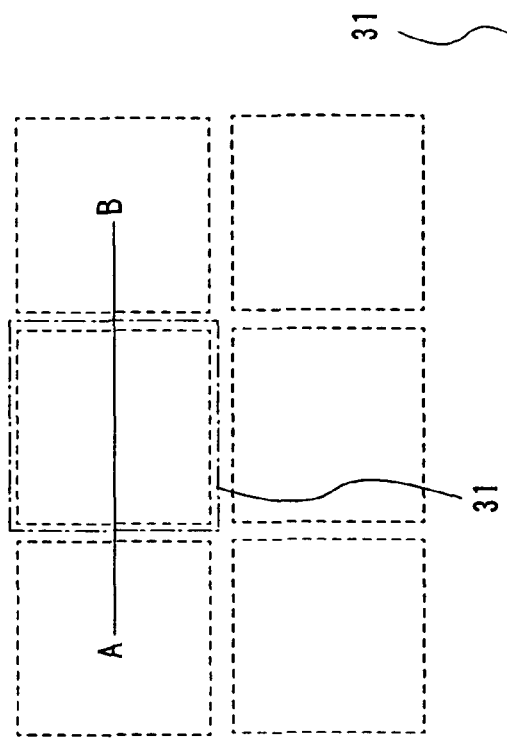
FIGS. 4A and 4B show a method of manufacturing a semiconductor device of the present invention.
Figure 4B:
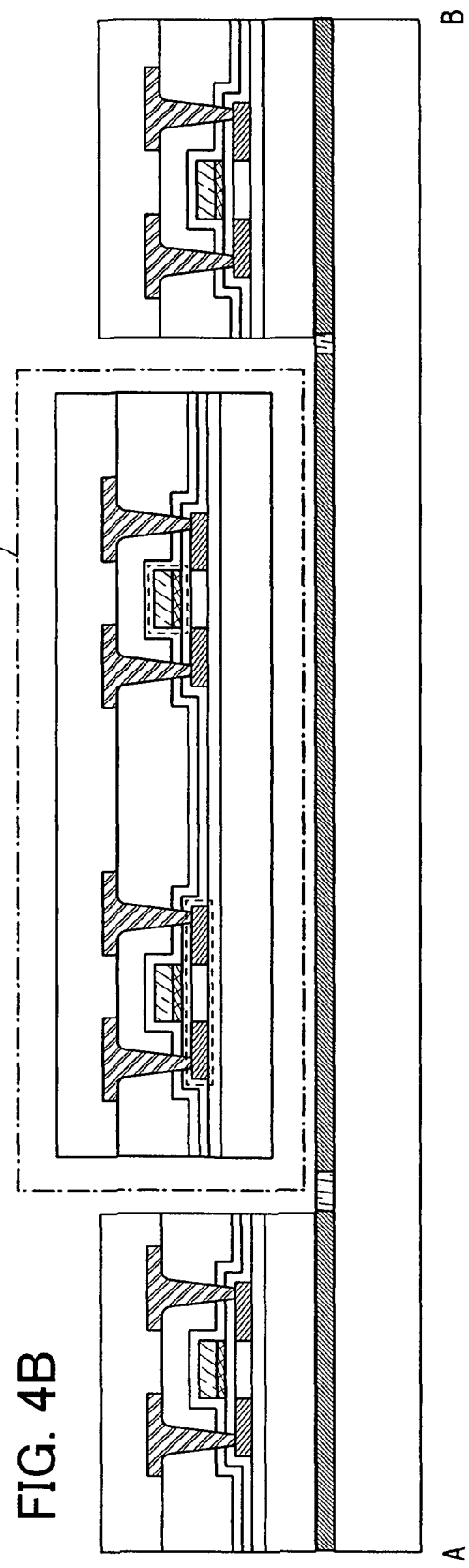

A manufacturing method of a semiconductor device of the present invention is described with reference to FIGS. 1A to 4B. A case in which six semiconductor devices are manufactured over a substrate is described below. In each of FIGS. 2A, 3A, and 4A, a region in which one semiconductor device is provided corresponds to a region 10 surrounded by a dotted line. FIGS. 2B, 3B, and 4B correspond to cross-sectional views taken along lines A-B in FIGS. 2A, 3A, and 4A, respectively. In addition, cross-sectional views in FIGS. 1A to 1D correspond to cross-sectional views taken along lines A-B in FIGS. 2A, 3A, and 4A.

Figure 1A:
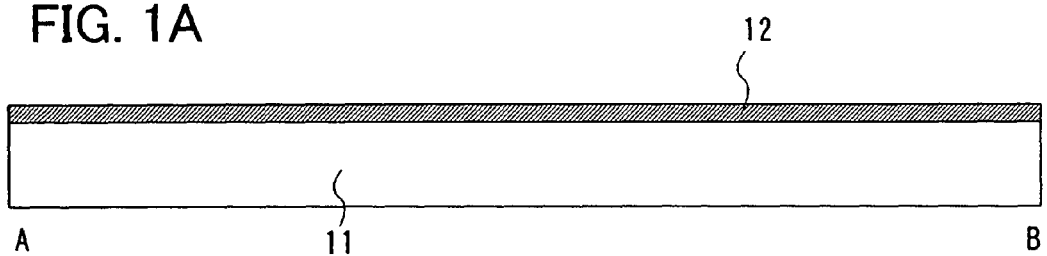
FIGS. 1A to 1D show a method of manufacturing a semiconductor device of the present invention.

First, a liquid repellent film 12 is formed over a substrate 11 as a liquid repellent self-assembled monolayer (see FIG. 1A). The liquid repellent film 12 may be formed using a silane coupling agent having a fluoroalkyl group (fluoroalkylsilane, hereinafter referred to as FAS). The substrate which is heated and FAS are confined so as to form a FAS self-assembled monolayer on a surface of the substrate by gas-phase reaction. Other than FAS, a substance having an alkyl group or a substance including a structure in which hydrogen in an alkyl group is replaced by fluorine may be used. A material for the liquid repellent film 12 may be selected in accordance with a substance for a base film to be formed.

Figure 1B:
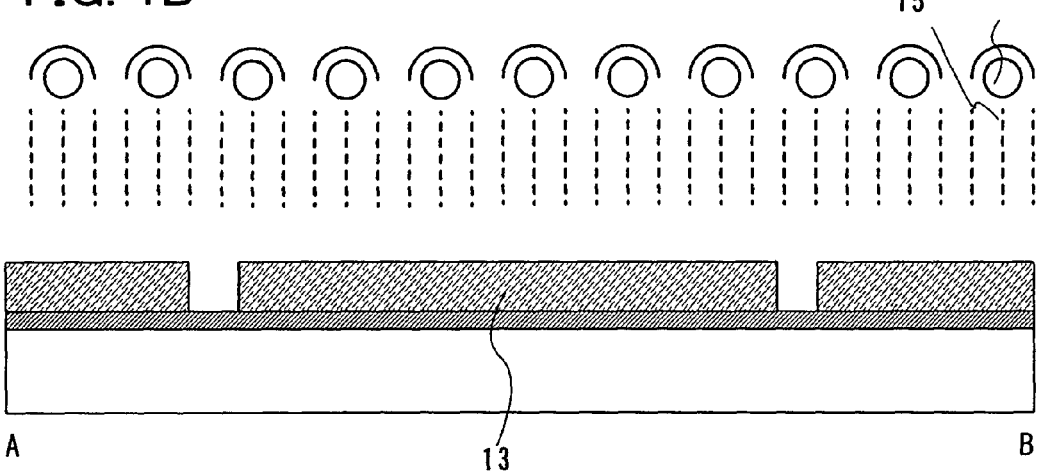
Figure 1C:
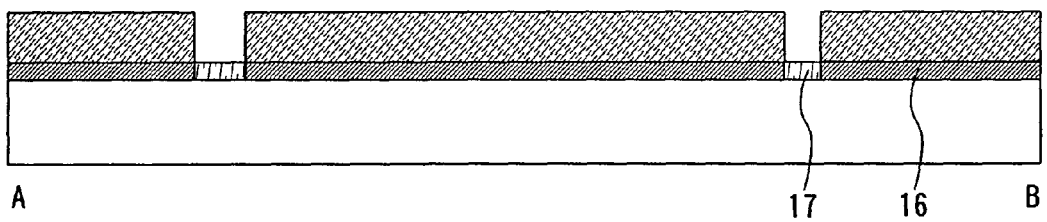

A mask 13 formed of a light blocking substance is formed over the substrate, on which the liquid repellent film 12 is formed (see FIG. 1B). The mask 13 is acceptable as long as the following conditions are satisfied: a substance of the mask 13 can block light 15 which is used in a following light exposure step, the mask 13 can be formed over the liquid repellent film 12, and the mask 13 does not damage the liquid repellent film 12 when the mask 13 is removed after the light exposure. In addition, the mask 13 may be formed only in a region which is peeled off in a following peeling step, that is, a region in which a stacked-layer body 31 is formed. The mask 13 is preferably formed of a resist. The mask 13 may be formed of a resist by a spin coating method, a droplet discharging method, or the like.

Then, a front surface of the substrate 11 on which the mask 13 is formed is light exposed using the light 15 emitted from a light source 14 (see FIG. 1B). A region in which the mask 13 is formed is not exposed to the light. On the other hand, a region in which the mask 13 is not formed is exposed to the light and a liquid repellent component in the liquid repellent film 12 therein is decomposed and removed. Here, the light 15 may have a wavelength of less than or equal to 200 nm. The region which is not exposed to the light, that is, a liquid repellent region is referred to as a first region 16, whereas the region which is exposed to the light, that is, a non-liquid repellent region is referred to as a second region 17 (see FIG. 1C). Further, the liquid repellent film 12 in periphery of an edge of the substrate is processed to be the second region 17 so that the periphery of the edge of the substrate is lyophilic, whereby a base film 18 which is formed in a following step is formed uniformly.

Then, the mask 13 is removed. A material or a method for removing the mask 13 is not particularly limited, as long as the mask 13 can be removed and the liquid repellency of the liquid repellent film 12 can be maintained.

Figure 1D:
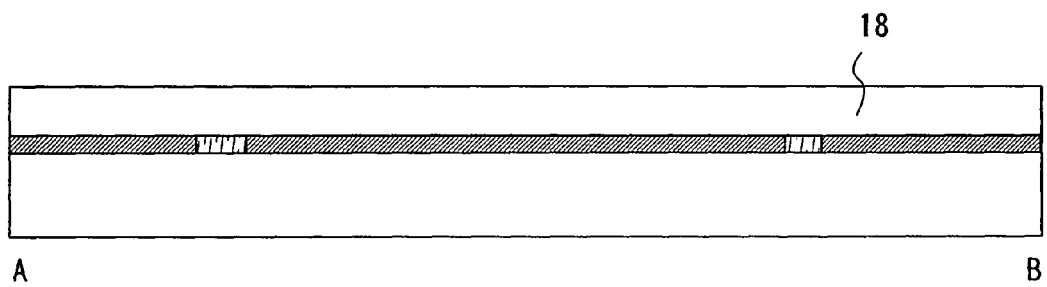

The base film 18 is formed over the substrate, on which the first region 16 and the second region 17 are formed (see FIG. 1D). The base film 18 is preferably formed of a material having high heat resistance. In addition, a precursor thereof, which is used for forming the base film 18, preferably has high viscosity. In addition, the base film 18 is not necessarily, but preferably, insulating. As a material for the base film 18, for example, an organic resin such as an acrylic resin, an epoxy resin, or polyimide may be used. In particular, polyimide is preferably used. Since polyimide has heat resistance of greater than or equal to 300° C., it can be said that polyimide is an organic resin with comparatively high heat resistance. An organic film of any of these materials is formed to have a thickness of greater than or equal to 400 nm and less than or equal to 20 µm, more preferably, greater than or equal to 10 µm and less than or equal to 20 µm. If the base film 18 is formed thicker than the foregoing ranges of values, the semiconductor device itself becomes thicker, which is not preferable. On the other hand, if the base film 18 is formed thinner than the foregoing ranges of values, the element is easily damaged and the base film 18 is easily broken during or after a peeling step. Here, a solution of a precursor of polyimide is applied by a spin coating method and baked, whereby a polyimide film is formed.

A TFT is formed over the substrate, which is provided with the liquid repellent film in a desired region as described above.

First, an insulating layer 19 is formed over the base film 18 (see FIG. 2B). Next, a layer including a plurality of transistors 20 is formed over the insulating layer 19. And then, insulating layers 22 and 23 are formed over the layer including the plurality of transistors 20. Next, a conductive layer 24 is formed, which is connected to source regions and drain regions of the plurality of transistors 20 through openings provided in the insulating layers 22 and 23. Then, an insulating layer 25 is formed so as to cover the conductive layer 24.

The substrate 11 is a glass substrate, a silicon substrate, a quartz substrate, or the like. The substrate 11 preferably is a glass substrate. A glass substrate longer than or equal to 1 meter on a side is easily manufactured, and a glass substrate is easily processed into a desired shape. Therefore, for example, when a large square glass substrate longer than or equal to 1 meter on a side is used, productivity can be considerably improved. Such good points are great advantages as compared with a case of using a circular silicon substrate. As long as a self-assembled monolayer can be formed thereover, a material for the substrate 11 is not particularly limited, and a substrate formed of aluminum oxide, silicon oxide, silicon nitride, titanium oxide, or the like can be used, in addition to those listed above.

The insulating layer 19 serves as a barrier film for impurities from outside. The insulating layer 19 is formed by a single layer or a stacked layer of a layer formed of oxide of silicon or nitride of silicon by a sputtering method, a plasma CVD method, or the like. A layer formed of oxide of silicon is a layer containing silicon (Si) and oxygen (O) as its main components, which corresponds to a layer formed of silicon oxide, a layer formed of silicon oxide containing nitrogen, or the like. A layer formed of nitride of silicon is a layer containing silicon and nitrogen (N) as its main components, which corresponds to a layer formed of silicon nitride, a layer formed of silicon nitride containing oxygen, or the like. Note that the insulating layer 19 is not necessarily formed when not needed. However, when the base film 18 is not insulating, the insulating layer 19 needs to be provided in order to insulate the base film 18 and the plurality of transistors 20.

Each of the plurality of transistors 20 has a semiconductor layer 26, an insulating layer 21, and a conductive layer 27. The semiconductor layer 26 may have an amorphous structure or a polycrystalline structure. In the case of a polycrystalline structure, an amorphous film may be crystallized after being formed. A method for the crystallization is not particularly limited and a laser crystallization method or a thermal crystallization method may be used. The semiconductor layer 26 includes an impurity region 28 serving as a source region or a drain region, and a channel formation region 29. An impurity element imparting an N-type or a P-type is added to the impurity region 28. In specific, an impurity element imparting an N-type (an element belonging to Group 15, such as phosphorus (P) or arsenic (As)) or an impurity element imparting a P-type (such as boron (B)) is added. The conductive layer 27 corresponds to a gate electrode and the insulating layer 21 corresponds to a gate insulating layer.

Note that, although only the plurality of transistors 20 are formed in the illustrated structure, the present invention is not limited thereto. An element which is provided over the substrate 11 may be appropriately determined in accordance with the use of the semiconductor device. In a case of forming a semiconductor device having a function to transmit and receive electromagnetic waves, for example, only a plurality of transistors may be formed, or alternatively, a plurality of transistors and a conductive layer serving as an antenna may be formed over the substrate 11. Note that the conductive layer serving as an antenna is not necessarily a single layer, but may be a multilayer in which a plurality of layers are stacked. In addition, in a case of forming a semiconductor device having a function to store data, a memory element (such as a transistor or a memory transistor) may be formed, as well as a plurality of transistors over the substrate 11. In a case of forming a semiconductor device having function to control a circuit, generate a signal, and the like (such as a CPU or a signal generation circuit), a transistor may be formed overt the substrate 11. Further, another element such as a resistor or a capacitor may be formed if necessary, in addition to those mentioned above. Note that, in the case of forming a semiconductor device having a function to transmit and receive electromagnetic waves, only a plurality of transistors may be formed over the substrate 11.

The insulating layers 22 and 23 are formed by a single layer or a stacked layer of an inorganic material or an organic material by a SOG (spin on glass) method, a droplet discharging method, a screen printing method, or the like. For example, a layer of nitride of silicon containing oxygen may be formed as the insulating layer 22 and a layer of oxide of silicon containing nitrogen may be formed as the insulating layer 23.

Next, a groove 30 is formed as a cut for peeling off an element group including TFTs. A laser beam may be used for forming the groove 30. The use of a laser beam allows manufacture of semiconductor devices having various shapes as shown in FIGS. 13A to 13D. A laser beam is selectively emitted to a desired region and the groove 30 is formed in one or a plurality of the insulating layers 21, 22, 23, and 25, which are provided in the layer including the plurality of transistors 20, the substrate 11, the liquid repellent film 12, the base film 18, and the insulating layer 19 (see FIGS. 3A and 3B). Note that, in the illustrated structure, the insulating layers 19, 21, 22, and 23 are cut and the groove 30 is formed in the base film 18, by a laser beam. The groove 30 preferably reaches the substrate 11. Note that, although a groove with its cross-sectional shape is a V-shape is shown in FIGS. 3A and 3B, the present invention is not limited thereto and a groove with any cross-sectional shape may be employed.

A laser includes a laser medium, an excitation source, and a resonator. Lasers are classified into a gas laser, a liquid laser, and a solid laser according to the medium, and are classified into a free electron laser, a semiconductor laser, and an X-ray laser according to the type of oscillation. Any type of laser may be used here. Note that a gas laser or a solid laser is preferably used and a solid laser is more preferably used.

The gas laser includes a helium-neon laser, a carbon dioxide gas laser, an excimer laser, and an argon ion laser. The excimer laser includes a rare gas excimer laser and a rare gas halide excimer laser. The rare gas excimer laser oscillates by three kinds of excited molecules: argon krypton, and xenon. The argon ion laser includes a rare gas ion laser and a metal vapor ion laser.

The liquid laser includes an inorganic liquid laser, an organic chelate laser, and a dye laser. The inorganic liquid laser and the organic chelate laser use rare earth ions such as neodymium, which are utilized for a solid laser as a laser medium.

A laser medium used in the solid laser is a solid base doped with active species which can cause laser action. The solid base is a crystal or glass. The crystal is YAG (yttrium aluminum garnet crystal), YLF, $YVO_4$, $YAlO_3$, sapphire, ruby, or alexandrite. In addition, the active species which can cause laser action are, for example, trivalent ions such as $Cr^{3+}$, $Nd^{3+}$, $Yb^{3+}$, $Tm^{3+}$, $Ho^{3+}$, $Er^{3+}$, and $Ti^{3+}$.

As a laser used in the present invention, a continuous wave laser, or a pulsed laser can be used. Laser beam irradiation conditions (such as frequency, power density, energy density, and beam profile) are controlled as appropriate in consideration of the thicknesses, materials, and the like of the substrate 11, the insulating layers 19, 21, 22, 23, and 25.

A solid laser having a wavelength of greater than or equal to 1 nm and less than or equal to 380 nm, which is an ultraviolet region, is preferably used as the laser so that the groove 30 reaches the substrate 11, in the case where the substrate 11 is a glass substrate. More preferably, an $Nd:YVO_4$ laser having a wavelength of greater than or equal to 1 nm and less than or equal to 380 nm, which is an ultraviolet region, is used. It is because light is easily absorbed in a substrate (especially a glass substrate) when a laser having a wavelength of an ultraviolet region is used, compared with when a laser having a longer wavelength is used, and an ablation process is easily processed. An ablation process of the $Nd:YVO_4$ laser is particularly easy.

Note that a laser irradiation device for emitting the foregoing laser beam includes a moving table, a substrate, a head portion, and a control portion. The moving table is provided with a suction hole. The substrate is held by the suction hole over the moving table. The head portion emits a laser beam which is emitted from a laser oscillation device through a laser head. The control portion positions the laser head at a desired location on the surface of the substrate by moving one or both of the moving table and the head portion, so that the desired portion is irradiated with the laser beam. Note that the control portion recognizes and determines a portion to be processed according to a relative position on the basis of a positioning mark over the substrate which is taken by a CCD camera.

Then, the stacked-layer body 31 including the plurality of transistors 20 is peeled off from the substrate 11 using the groove 30, which is formed. Since the liquid repellent film 12 is formed, adhesion between the base film 18 and the substrate 11 is low; therefore, the peeling can be easily conducted. A sticky tape or the like is attached to one side of the region 10 surrounded by a dotted line and pull the tape, whereby the peeling can be conducted. In this manner, a semiconductor element group including TFTs formed by the stacked-layer body 31 can be manufactured.

Note that, the liquid repellent region and the non-liquid repellent region are formed by light exposure in this embodiment mode, the present invention is not limited thereto. For example, the liquid repellent film may be selectively formed using a droplet discharging method or the like without forming the mask.

According to the present invention, the possibility that a TFT and a peripheral element are influenced mechanically or electrostatically and damaged in a peeling step for transferring the TFT can be reduced.

In the present invention, a TFT is formed over a substrate having heat resistance; therefore, the TFT can be manufactured without specific restriction on apparatuses, conditions, and the like, compared with a case of manufacturing the TFT directly over a plastic substrate. Accordingly, the TFT can be manufactured as in a conventional case in which the TFT is formed over a plastic substrate through peeling and transferring steps.

Further, by using the present invention, the semiconductor device itself can be thin compared with a conventional case in which a TFT is transferred to a plastic substrate.

Embodiment Mode 2

In a method of manufacturing a semiconductor device of the present invention, FAS can be decomposed by back surface light exposure. The use of back surface light exposure can omit a removing step of a mask. In this embodiment mode, a substrate with a light-transmitting property (hereinafter, referred to as a light-transmitting substrate) is used so that back surface light exposure can be conducted. A substrate which transmits light that is used in the back surface light exposure is used as the light-transmitting substrate. A description is made below with reference to FIGS. 2A to 5D. Note that the same layers are denoted by the same reference numerals in different embodiment modes.

First, the mask which blocks light is formed over a light-transmitting substrate 11a. As the light-transmitting substrate 11a, a quartz substrate may be used, for example. A material for the mask 13 is not specifically limited and is acceptable as long as the material can block the light 15 which is used in a following light exposure step. The mask 13 may be formed in a region which is peeled off in a following peeling step, that is, a region in which the stacked-layer body 31 is formed. A photolithography method is used here to form the mask 13, but a droplet discharging method may be used. The mask may be formed by direct drawing with a laser after a material of the mask is deposited on an entire surface. Alternatively, a screen printing method is applicable.

Figure 5A:
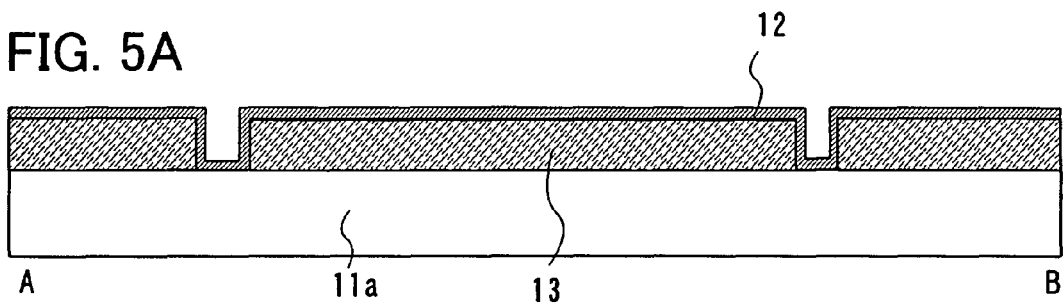
FIGS. 5A to 5D show a method of manufacturing a semiconductor device of the present invention.

Then, the liquid repellent film 12 is formed as a liquid repellent self-assembled monolayer over the light-transmitting substrate 11a and the mask 13 (see FIG. 5A). When the mask 13 is formed using titanium, aluminum, tungsten, silicon, or the like, a self-assembled monolayer of FAS can be formed over a natural oxide film on a surface of the material. Accordingly, FAS can be used for the liquid repellent film 12. The mask 13 is preferably formed of a resist. The mask 13 may be formed of a resist by a spin coating method, a droplet discharging method, or the like.

Figure 5B:
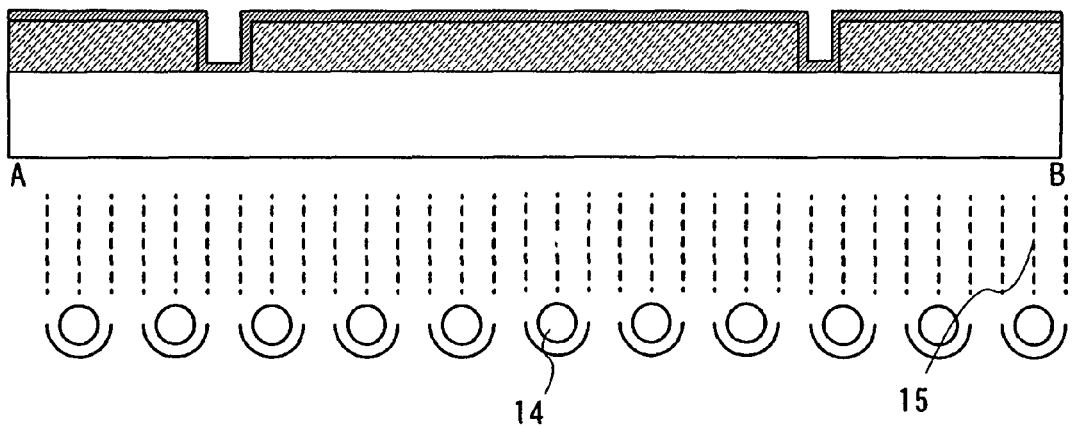
Figure 5C:
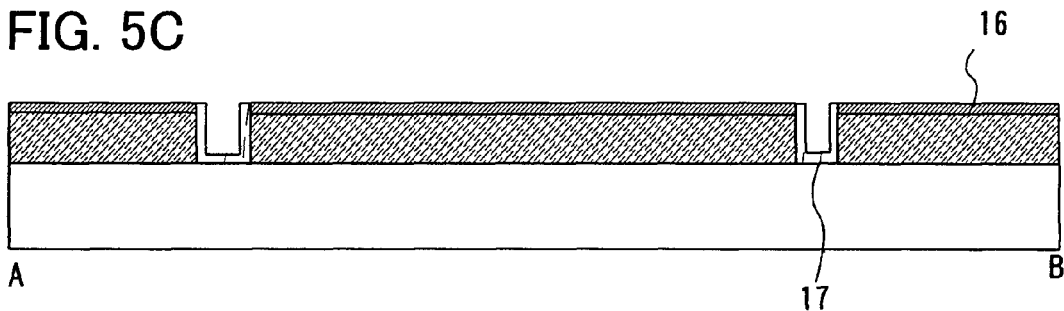

Next, a back surface of the light-transmitting substrate 11a on which the mask 13 is formed is light exposed using the light 15 emitted from the light source 14 (see FIG. 5B). A region in which the mask 13 is formed is not exposed to the light. On the other hand, a region in which the mask 13 is not formed is exposed to the light and the liquid repellent film 12 therein is decomposed and a liquid repellent component therein is removed. Here, light which can pass through the light-transmitting substrate 11a and is in a wavelength range with which the liquid repellent film 12 can be decomposed is used as the light 15. For example, the light 15 may have a wavelength of less than or equal to 200 nm. The region which is not exposed to the light is referred to as the first region 16, whereas the region which is exposed to the light is referred to as the second region 17 (see FIG. 5C). Further, the periphery of the edge of the substrate 11a is made to be non-liquid repellent, whereby the base film 18 which is formed in a following step can be formed uniformly.

Figure 5D:
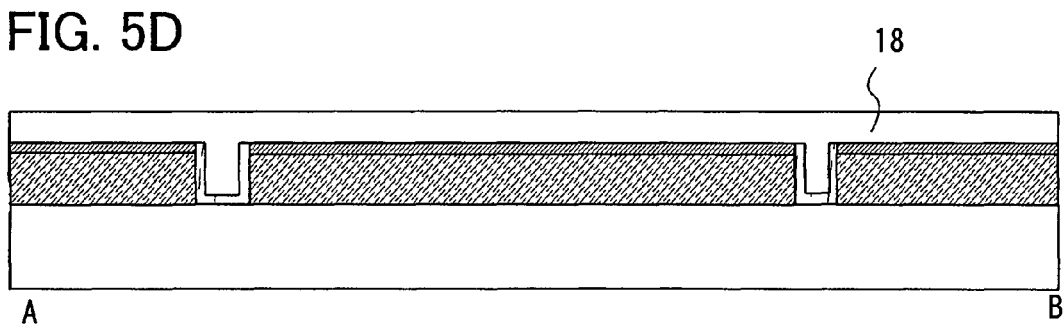

The base film 18 is formed over the substrate, on which the first region 16 and the second region 17 are formed (see FIG. 5D). The base film 18 is preferably formed of a material having high heat resistance. In addition, a precursor thereof, which is used for the base film 18, preferably has high viscosity. As such a material, for example, an organic resin such as an acrylic resin, an epoxy resin, or polyimide is used. In particular, polyimide is preferably used. Polyimide has heat resistance of greater than or equal to 300° C., which is comparatively high heat resistance. An organic film of any of these materials is formed to have a thickness of greater than or equal to 400 nm and less than or equal to 20 μm, more preferably, greater than or equal to 10 μm and less than or equal to 20 μm. If the base film 18 is formed thicker than the foregoing ranges of values, the semiconductor device itself becomes thicker, which is not preferable. On the other hand, if the base film 18 is formed thinner than the foregoing ranges of values, the element is easily damaged and the base film 18 is easily broken during or after a peeling step. Here, a solution of a precursor of polyimide is applied by a spin coating method and baked, whereby a polyimide film is formed.

A TFT is formed over the substrate, on which the liquid repellent film is formed in a desired region as described above, as in Embodiment Mode 1. A groove is formed using a laser or a scriber, or both of them, in a periphery of an edge of a region in which the TFTs are formed. Then, peeling is conducted. In this manner, a semiconductor element group including TFTs formed by the stacked-layer body 31 can be manufactured.

According to the present invention, the possibility that a TFT and a peripheral element are influenced mechanically or electrostatically and damaged in a peeling step for transferring the TFT can be reduced.

In the present invention, a TFT is formed over a substrate having heat resistance; therefore, the TFT can be manufactured without specific restriction on apparatuses, conditions, and the like compared with a case of manufacturing the TFT directly over a plastic substrate. Accordingly, the TFT can be manufactured as in a conventional case in which the TFT is formed over a plastic substrate through peeling and transferring steps.

Further, when back surface light exposure is used as described in this embodiment mode, a removing step of a mask is not necessary, so that a TFT of the present invention can be manufactured with a small number of steps.

Furthermore, by using the present invention, the semiconductor device itself can be thin compared with a conventional case in which a TFT is transferred to a plastic substrate.

Embodiment Mode 3

In a method of manufacturing a semiconductor device of the present invention, FAS can be decomposed by back surface light exposure as described in Embodiment Mode 2. Note that, since it is necessary to use light which is in a wavelength range with which the light can pass through a light-transmitting substrate and a liquid repellent film can be decomposed, there is a possibility that the light in a wavelength range needed for decomposition of the liquid repellent film does not reach the liquid repellent film, depending on a combination of the light-transmitting substrate and the liquid repellent film. A case in which a glass substrate is used as the light-transmitting substrate and FAS is used for the liquid repellent film can be given as an example of such a situation. A glass substrate does not transmit light in a wavelength range of less than or equal to 300 nm, whereas FAS needs light in a wavelength of less than or equal to 200 nm to be decomposed; therefore, a liquid repellent region and a non-liquid repellent region cannot be formed selectively by back surface light exposure as in Embodiment Mode 2. To solve this problem, a photocatalyst is used in this embodiment mode. A description is made below with reference to FIGS. 2A to 4B, and 6A to 6D. Note that the same layers are denoted by the same reference numerals in different embodiment modes.

First, a mask 13 which blocks light is formed over a light-transmitting substrate 11b. A substance for the mask 13 is not specifically limited and is acceptable as long as the material can block light which is used in a following light exposure step. The mask 13 may be formed in a region which is peeled off in a following peeling step, that is, a region in which the stacked-layer body 31 is formed. A photolithography method is used here to form the mask 13, but a droplet discharging method may be used. The mask may be formed by direct drawing with a laser after a material of the mask is deposited on an entire surface. Alternatively, a screen printing method is applicable.

Then, a photocatalyst film 32 is formed. As a photocatalytic substance for forming the photocatalyst film 32, titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$), or the like can be given.

The photocatalyst film 32 can be formed by a dip-coating method of a sol-gel method, a spin coating method, a droplet discharging method, an ion plating method, an ion beam method, a CVD method, a sputtering method, an RF magnetron sputtering method, a plasma splay coating method, a plasma spraying method, an anodization method, or the like. The photocatalyst film 32 does not necessarily have continuity as a film depending on its forming method. In a case in which a photocatalytic substance includes an oxide semiconductor including a plurality of metals, the photocatalytic substance can be formed by mixing and dissolving salts of constituent elements. In a case in which the photocatalyst film 32 is formed by a coating method such as a dip coating method or a spin coating method, the photocatalyst film may be baked or dried to remove a solvent if necessary. In specific, the photocatalyst film may be heated at a predetermined temperature set according to its material. Preferably, the photocatalyst film may be heated and crystallized in an atmosphere containing oxygen.

By this heating treatment, the photocatalyst film 32 can have a predetermined crystalline structure. For example, the photocatalyst film 32 has an anatase-type, or rutile-anatase mixed type crystalline structure. An anatase-type crystalline structure is preferentially formed in a low-temperature phase. Accordingly, when a photocatalytic substance does not have a predetermined crystalline structure, the photocatalytic substance may be heated. In addition, when the photocatalyst film is formed by a coating method, the photocatalytic substance may be deposited in a plurality of times to obtain a predetermined film thickness.

Further, the photocatalytic substance is doped with a transition metal (Pd, Pt, Cr, Ni, V, Mn, Fe, Ce, Mo, W, or the like), so that photocatalytic activity is enhanced and the photocatalytic substance can be activated by light in a visible light range (wavelength of 400 to 800 nm). This is because a transition metal can form a new level in a forbidden band of an active photocatalytic substance having a wide band gap and can expand a light absorption range of the photocatalytic substance to the visible light range. For example, doping of an acceptor type such as Cr or Ni, a donor type such as V or Mn, an amphoteric type such as Fe, or Ce, Mo, W, and the like can be conducted. In such a manner, a wavelength of the light can be determined by a photocatalytic substance.

When the photocatalytic substance is heated and reduced in vacuum or under hydrogen flow, an oxygen defect is caused in a crystal. Even when doping with a transition element is not conducted, an oxygen defect serves similarly to an electron donor. In particular, in a case in which the photocatalyst film is formed by a sol-gel method, an oxygen defect exists from the time of formation; therefore, the photocatalytic substance is not necessarily reduced. In addition, an oxygen defect can be formed by doping with a gas such as $N_2$.

Here, a titanium oxide film is formed as the photocatalyst film 32. The titanium oxide film is formed by applying a $TiCl_3$ solution by a spin coating method and baking in an oxygen atmosphere. A material and the thickness of the photocatalyst film 32 are set so that it can transmit light 15b which is used in light exposure later.

Figure 6A:
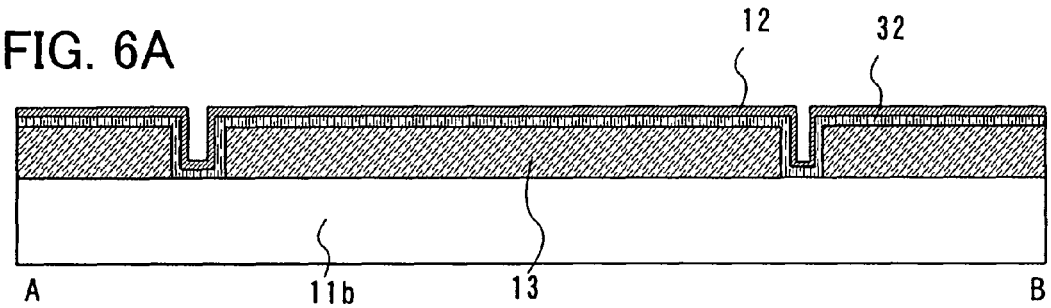
FIGS. 6A to 6D show a method of manufacturing a semiconductor device of the present invention.

Then, the liquid repellent film 12 is formed as a liquid repellent self-assembled monolayer over the light-transmitting substrate 11b, the mask 13 and the photocatalyst film 32 (see FIG. 6A). The mask 13 is preferably formed of a resist. The mask 13 may be formed of a resist by a spin coating method, a droplet discharging method, or the like.

Figure 6B:
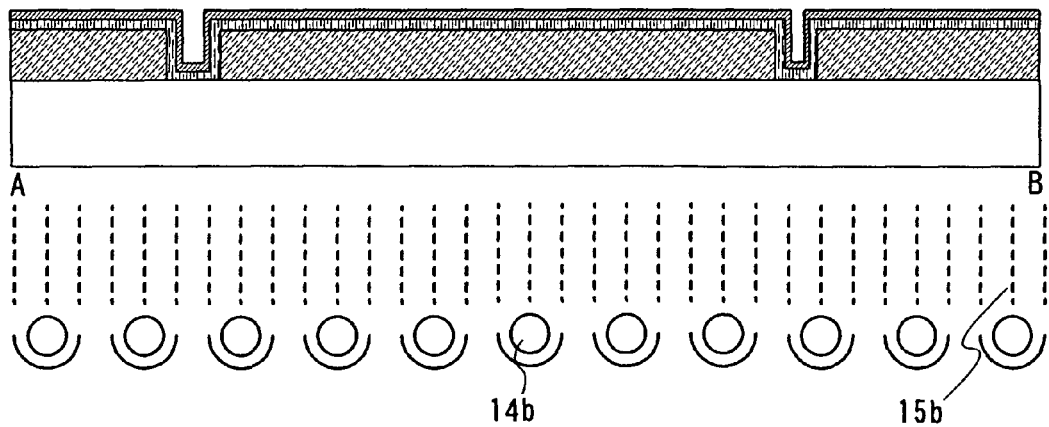
Figure 6C:
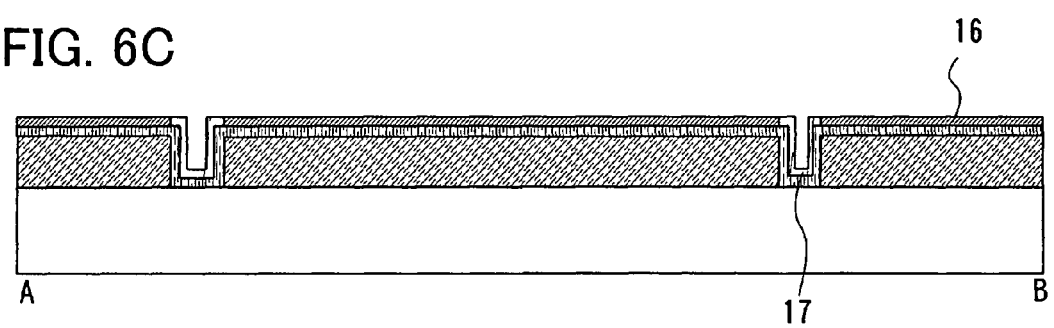

Next, a back surface of the light-transmitting substrate 11b on which the mask 13 is formed is light exposed using the light 15b emitted from a light source 14b (see FIG. 6B). A region in which the mask 13 is formed is not exposed to the light. On the other hand, a region in which the mask 13 is not formed is exposed to the light and the liquid repellent film 12 therein is decomposed and a liquid repellent component therein is removed. Here, light in a wavelength range with which the light can pass through the light-transmitting substrate 11b is used as the light 15b. The photocatalyst film 32 is irradiated with the light 15b to be activated. The light 15b may have a wavelength of greater than or equal to 300 and less than or equal to 400 nm. The region in which the liquid repellent film 12 is not exposed to the light is referred to as the second region 17, whereas the region in which the liquid repellent film 12 is not exposed to the light is referred to as the first region 16 (see FIG. 6C). Further, the periphery of the edge of the substrate is made to be non-liquid repellent, whereby the base film 18 which is formed in a following step can be formed uniformly.

In this embodiment mode, an example is shown in which the mask 13 which blocks light, the photocatalyst film 32, the liquid repellent film 12 as a liquid repellent self-assembled monolayer are sequentially formed over the light-transmitting substrate 11b. However positions of the photocatalyst film and the liquid repellent film are not limited thereto. Although not shown, the mask 13 which blocks light, the liquid repellent film 12, and the photocatalyst film 32 are sequentially formed over the light-transmitting substrate 11b. In this case, when the mask 13 is formed using titanium, aluminum, tungsten, silicon, or the like, a self-assembled monolayer of FAS can be formed over a natural oxide film on a surface of the material; therefore, FAS can be used for the liquid repellent film 12. After the first region 16 and the second region 17 are formed, the photocatalyst film 32 may be removed. A method by which the liquid repellency of the liquid repellent film 12 is not influenced is employed when the photocatalyst film 32 is removed.

Figure 6D:
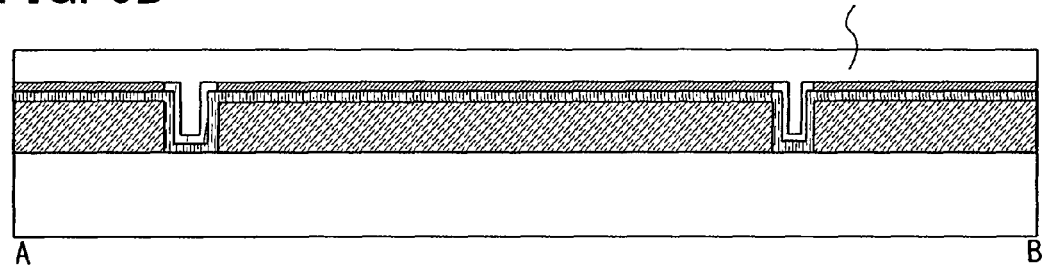

The base film 18 is formed over the substrate, on which the first region 16 and the second region 17 are formed (see FIG. 6D). The base film 18 is preferably formed of a material with high heat resistance. In addition, a precursor thereof, which is used for the base film 18, preferably has high viscosity. As such a material, for example, an organic resin such as an acrylic resin, an epoxy resin, or polyimide is used. In particular, polyimide is preferably used. Polyimide has heat resistance of greater than or equal to 300° C., which is comparatively high heat resistance. An organic film of any of these materials is formed to have a thickness of greater than or equal to 400 nm and less than or equal to 20 μm, more preferably, greater than or equal to 10 μm and less than or equal to 20 μm.

If the base film 18 is formed thicker than the foregoing ranges of values, the semiconductor device itself becomes thicker, which is not preferable. On the other hand, if the base film 18 is formed thinner than the foregoing ranges of values, the element is easily damaged and the base film 18 is easily broken during or after a peeling step. Here, a solution of a precursor of polyimide is applied by a spin coating method and baked, whereby a polyimide film is formed.

A TFT is formed over the substrate, on which the liquid repellent film is formed in a desired region as described above, as in another embodiment mode. A groove is formed using a laser or a scriber, or both of them, in a periphery of an edge of a region in which the TFTs are formed. Then, peeling is conducted. In this manner, a semiconductor element group formed by the stacked-layer body 31 including TFTs can be manufactured.

According to the present invention, the possibility that a TFT and a peripheral element are influenced mechanically or electrostatically and damaged in a peeling step for transferring the TFT can be reduced.

In the present invention, a TFT is formed over a substrate having heat resistance; therefore, the TFT can be manufactured without specific restriction on apparatuses, conditions, and the like, compared with a case of manufacturing the TFT directly over a plastic substrate. Accordingly, the TFT can be manufactured as in a conventional case in which the TFT is formed over a plastic substrate through peeling and transferring steps.

Further, when back surface light exposure is used as described in this embodiment mode, a removing step of a mask is not necessary, so that a TFT of the present invention can be manufactured with a small number of steps.

Furthermore, by using the present invention, the semiconductor device itself can be thin compared with a conventional case in which a TFT is transferred to a plastic substrate.

Embodiment Mode 4

Another mode of a method of manufacturing a semiconductor device of the present invention is described with reference to FIGS. 7A and 7B. Here, a liquid repellent region and a non-liquid repellent region are selectively formed without light exposure. Note that the same layers are denoted by the same reference numerals in different embodiment modes.

First, a mask 13a is formed over a substrate 11c. The substrate 11c is a glass substrate, a silicon substrate, a quartz substrate, or the like. The substrate 11c preferably is a glass substrate. A glass substrate longer than or equal to 1 meter on a side is easily manufactured, and a glass substrate is easily processed into a desired shape. Therefore, for example, when a large square glass substrate longer than or equal to 1 meter on a side is used, productivity can be considerably improved. Such good points are great advantages as compared with a case of using a circular silicon substrate. As long as a liquid repellent film 12a cannot be formed over the substrate in a following step, a material for the substrate 11c is not particularly limited, and a substrate formed of aluminum oxide, silicon oxide, silicon nitride, titanium oxide, or the like may be used, in addition to those listed above. The mask 13a does not necessarily transmit light. The mask 13a may be formed of a substance over which the liquid repellent film 12a can be formed. The mask 13a may be formed in a region which is peeled off in a following peeling step, that is, a region in which the stacked-layer body 31 is formed. In addition, a photolithography method is used here to form the mask 13a, but a droplet discharging method may be used. The mask may be formed by direct drawing with a laser after a material of the mask 13a is formed on an entire surface. Alternatively, a screen printing method is applicable. Note that, in this embodiment mode, the mask 13a does not serve as a mask, but the mask 13a is referred to as a mask for comparison or the like with another embodiment mode and for convenience in description.

Figure 7A:
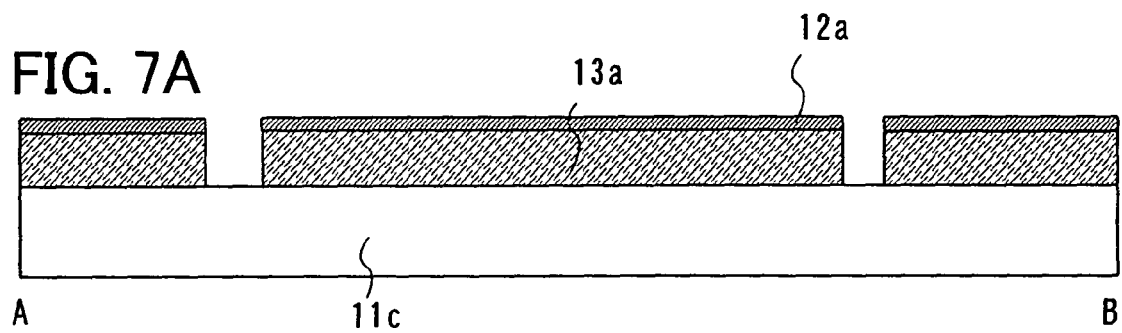
FIGS. 7A and 7B show a method of manufacturing a semiconductor device of the present invention.

Then, the liquid repellent film 12a is formed as a liquid repellent self-assembled monolayer over the mask 13a (see FIG. 7A). The mask 13a may be formed of gold (Au), silver (Ag), platinum (Pt), copper (Cu), palladium (Pd), rhodium (Rh), ruthenium (Ru), or an alloy containing any of these elements as its main component. The liquid repellent film 12a may be formed using a chemical solution containing a mercapto group such as thiol or mercaptan. Fluoroalkyl thiol may be dissolved in an organic solvent to form a solution which is prepared to have a concentration of approximately 1 mM, and the substrate 11c provided with the mask 13a may be soaked therein, whereby the liquid repellent film 12a is formed. In this manner, the liquid repellent film 12a is formed only in a region in which the mask 13a is formed over the substrate 11c.

Figure 7B:
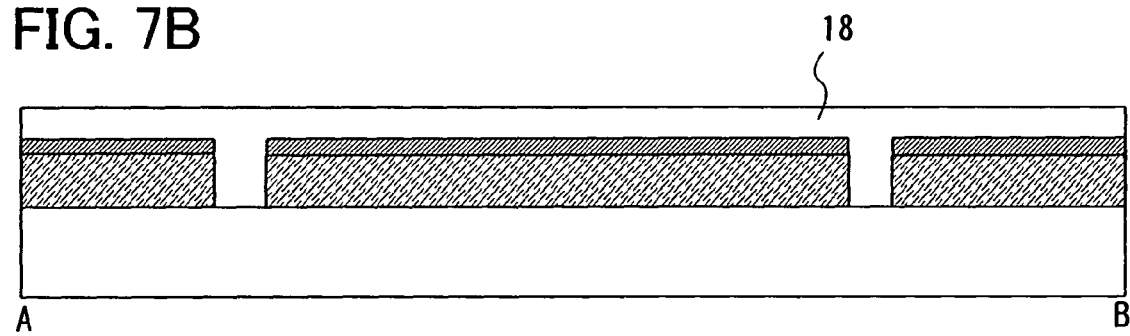

Then, the base film 18 is formed over the substrate 11c and the liquid repellent film 12a (see FIG. 7B). The base film 18 is preferably formed of a material with high heat resistance. In addition, a precursor thereof, which is used for the base film 18, preferably has high viscosity. As such a material, for example, an organic resin such as an acrylic resin, an epoxy resin, or polyimide is used. In particular, polyimide is preferably used. Polyimide has heat resistance of greater than or equal to 300° C., which is comparatively high heat resistance. An organic film of any of these materials is formed to have a thickness of greater than or equal to 400 nm and less than or equal to 20 μm, more preferably, greater than or equal to 10 μm and less than or equal to 20 μm. If the base film 18 is formed thicker than the foregoing ranges of values, the semiconductor device itself becomes thicker, which is not preferable. On the other hand, if the base film 18 is formed thinner than the foregoing ranges of values, the element is easily damaged and the base film 18 is easily broken during or after a peeling step. Here, a solution of a precursor of polyimide is applied by a spin coating method and baked, whereby a polyimide film is formed.

A TFT is formed over the substrate, on which the liquid repellent film 12a is formed in a desired region as described above, as in Embodiment Mode 1. A groove is formed using a laser or a scriber, or both of them, in a periphery of an edge of a region in which the TFTs are formed. Then, peeling is conducted. In this manner, a semiconductor element group formed by the stacked-layer body 31 including TFTs can be manufactured.

According to the present invention, the possibility that a TFT and a peripheral element are influenced mechanically or electrostatically and damaged in a peeling step for transferring the TFT can be reduced.

In the present invention, a TFT is formed over a substrate having heat resistance; therefore, the TFT can be manufactured without specific restriction on apparatuses, conditions, and the like, compared with a case of manufacturing the TFT directly over a plastic substrate. Accordingly, the TFT can be manufactured as in a conventional case in which the TFT is formed over a plastic substrate through peeling and transferring steps.

Further, in this embodiment mode, a removing step of a mask is not necessary, so that a TFT of the present invention can be manufactured with a small number of steps.

Furthermore, by using the present invention, the semiconductor device itself can be thin compared with a conventional case in which a TFT is transferred to a plastic substrate.

Embodiment Mode 5

Another mode of a method of manufacturing a semiconductor device of the present invention is described with reference to FIGS. 8A and 8B. In this embodiment mode, an element group is manufactured to have a desired microfabrication pattern on its back side. Note that the same layers are denoted by the same reference numerals in different embodiment modes.

Figure 8A:
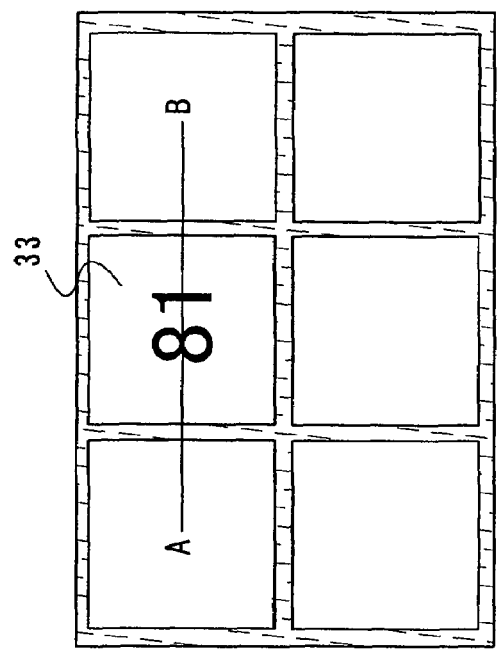
FIGS. 8A and 8B show a method of manufacturing a semiconductor device of the present invention.
Figure 8B:
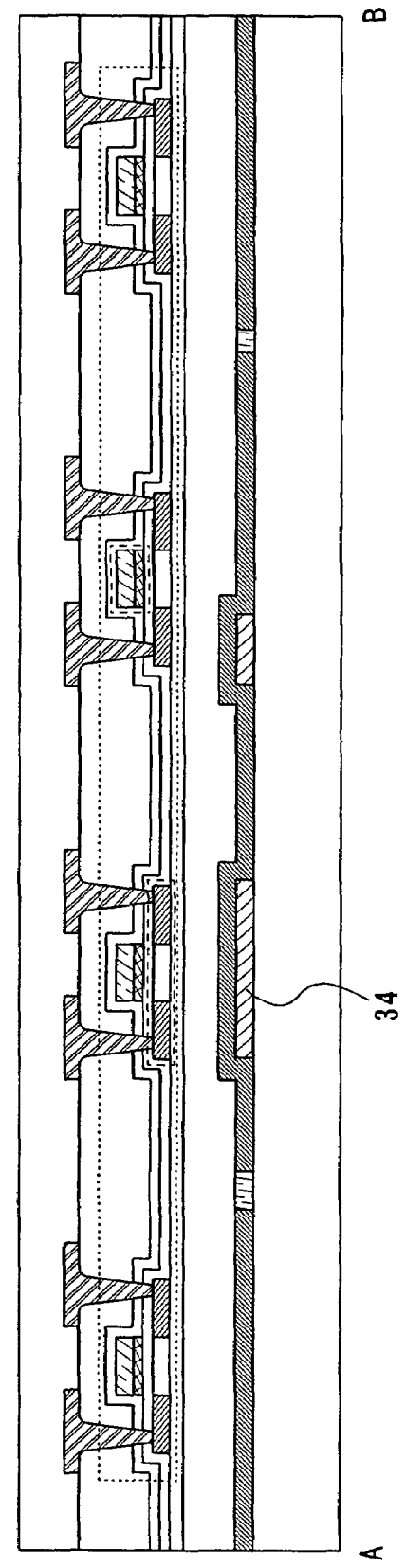

In FIGS. 8A and 8B, a region 33 exists, in which one semiconductor element group is formed. In the region 33 in the substrate 11, a pattern which can be read as "81" is formed. When the pattern is used as a die, a semiconductor device which has an element group with a pattern on its back side can be manufactured.

First, a pattern layer 34 is formed over the substrate 11. The pattern layer 34 is formed for forming a pattern and a material thereof is not specifically limited, as long as the liquid repellent film 12 can be formed thereover in a following step. When FAS self-assembled monolayer is used for the liquid repellent film 12 as in Embodiment Mode 1, silicon oxide can be used for the pattern layer 34. Silicon oxide is deposited by a plasma CVD method or the like, and a pattern thereof is formed by a photolithography method, or the like.

A photolithography method is used here to form the pattern layer 34, but a droplet discharging method may be used to form a pattern of the pattern layer 34. The pattern layer may be formed by direct drawing with a laser after a material of the pattern layer is deposited on an entire surface. Alternatively, the pattern may be formed using a screen printing method. These methods are inferior to a photolithography method in microfabrication, but these methods can form a thick film. When the pattern layer has a width as large as approximately one millimeter, a droplet discharging method is preferable. As the pattern layer 34, silicon oxide, silicon nitride, silicon oxynitride, or the like, siloxane, or organosiloxane can be used.

Then, the liquid repellent film 12 is formed over the pattern layer 34 as in Embodiment Mode 1. The liquid repellent film 12 may be formed using a substance having a structure in which hydrogen in an alkyl group is replaced by fluorine. For example, a silane coupling agent having a fluoroalkyl group (FAS) may be used. The substrate which is heated and FAS are confined so as to form a FAS self-assembled monolayer on a surface of the substrate by gas-phase reaction. Although a substance having an alkyl group is water repellent, liquid repellency is needed in the present invention; therefore, the substance having a structure in which hydrogen in an alkyl group is replaced by fluorine is used.

The mask 13 formed of a light blocking substance is formed as in Embodiment Mode 1, over the substrate on which the liquid repellent film 12 is formed. The mask 13 is acceptable as long as the following conditions are satisfied: a substance of the mask 13 can block the light 15 which is used in a following light exposure step, the mask 13 can be formed over the liquid repellent film 12, and the mask 13 does not damage the liquid repellent film 12 when the mask 13 is removed. In addition, the mask 13 may be formed in a region which is peeled off in a following peeling step, that is, a region in which the stacked-layer body 31 is formed. The mask 13 is preferably formed of a resist. The mask 13 may be formed of a resist by a spin coating method, a droplet discharging method, or the like.

Next, a front surface of the substrate 11 on which the mask 14 is formed is light exposed using the light 15 emitted from the light source 14 (see FIG. 1B). A region in which the mask 13 is formed is not exposed to the light. On the other hand, a region in which the mask 13 is not formed is exposed to the light and a liquid repellent component in the liquid repellent film 12 therein is decomposed and removed. Here, the light 15 may have a wavelength of less than or equal to 200 nm. As in Embodiment Mode 1, the region which is not exposed to the light, that is, a liquid repellent region is referred to as the first region 16, whereas a region which is exposed to the light, that is, a non-liquid repellent region is referred to as the second region 17 (see FIG. 1C). Further, the liquid repellent film 12 in periphery of an edge of the substrate is processed to be the second region 17 so that the periphery of the edge of the substrate is lyophilic, whereby a base film 18 which is formed in a following step is formed uniformly.

Then, the mask 13 is removed. A material or a method for removing the mask 13 is not particularly limited, as long as the mask 13 can be removed and the liquid repellency of the liquid repellent film 12 can be maintained.

Then, the base film 18 is formed over the substrate, on which the first region 16 and the second region 17 are formed, as in Embodiment Mode 1. The base film 18 is preferably formed of a material with high heat resistance. In addition, a precursor thereof, which is used for forming the base film 18, preferably has high viscosity. As such a material, for example, an organic resin such as an acrylic resin, an epoxy resin, or polyimide may be used. In particular, polyimide is preferably used. Polyimide has heat resistance of greater than or equal to 300° C., which is comparatively high heat resistance. An organic film of any of these materials is formed to have a thickness of greater than or equal to 400 nm and less than or equal to 20 μm, more preferably, greater than or equal to 10 μm and less than or equal to 20 μm. If the base film 18 is formed thicker than the foregoing ranges of values, the semiconductor device itself becomes thicker, which is not preferable. On the other hand, if the base film 18 is formed thinner than the foregoing ranges of values, the element is easily damaged and the base film 18 is easily broken during or after a peeling step. Here, a solution of a precursor of polyimide is applied by a spin coating method and baked, whereby a polyimide film is formed.

As described above, a polyimide film having a pattern based on a projection and a depression of the pattern layer 34 is formed. When seen from the back side of the semiconductor device, a projection of the pattern layer 34 corresponds to a depression in the polyimide film, whereas a depression of the pattern layer 34 corresponds to a projection in the polyimide film. In other words, a pattern mirror symmetric to "81" is formed on a back side of the formed element group.

A TFT is formed over the substrate 11, on which the liquid repellent film is formed in a desired region as described above as in Embodiment Mode 1. A groove is formed using a laser or a scriber, or both of them, in the region 33 in which the TFT is formed. Then, peeling is conducted. In this manner, a semiconductor element group including TFTs formed by the stacked-layer body 31 can be manufactured.

According to the present invention, the possibility that a TFT and a peripheral element are influenced mechanically or electrostatically and damaged in a peeling step for transferring the TFT can be reduced.

In the present invention, a TFT is formed over a substrate having heat resistance; therefore, the TFT can be manufactured without specific restriction on apparatuses, conditions, and the like, compared with a case of manufacturing the TFT directly over a plastic substrate. Accordingly, the TFT can be manufactured as in a conventional case in which the TFT is formed over a plastic substrate through peeling and transferring steps.

Furthermore, by using the present invention, the semiconductor device itself can be thin compared with a conventional case in which a TFT is transferred to a plastic substrate.

Further, as described in this embodiment mode, a semiconductor device which has an element group with a desired pattern on its back side can be easily manufactured.

Embodiment Mode 6

A semiconductor device of the present invention including an element group which has a desired microfabrication pattern on its back side as in Embodiment Mode 5 is described with reference to FIGS. 9A and 9B. Note that the same layers are denoted by the same reference numerals in different embodiment modes.

Figure 9A:
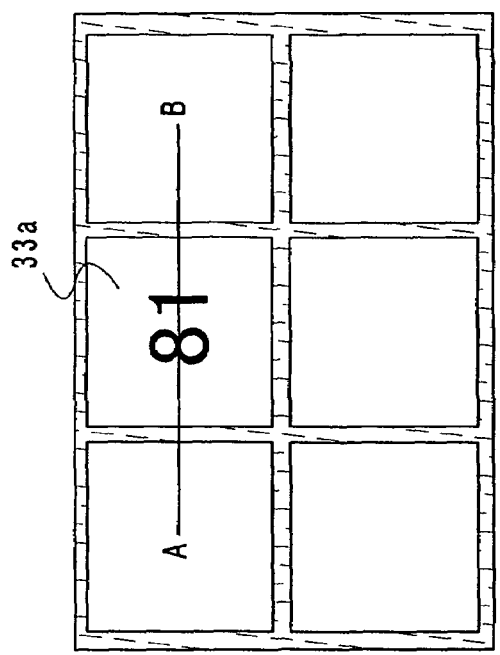
FIGS. 9A and 9B show a method of manufacturing a semiconductor device of the present invention.
Figure 9B:
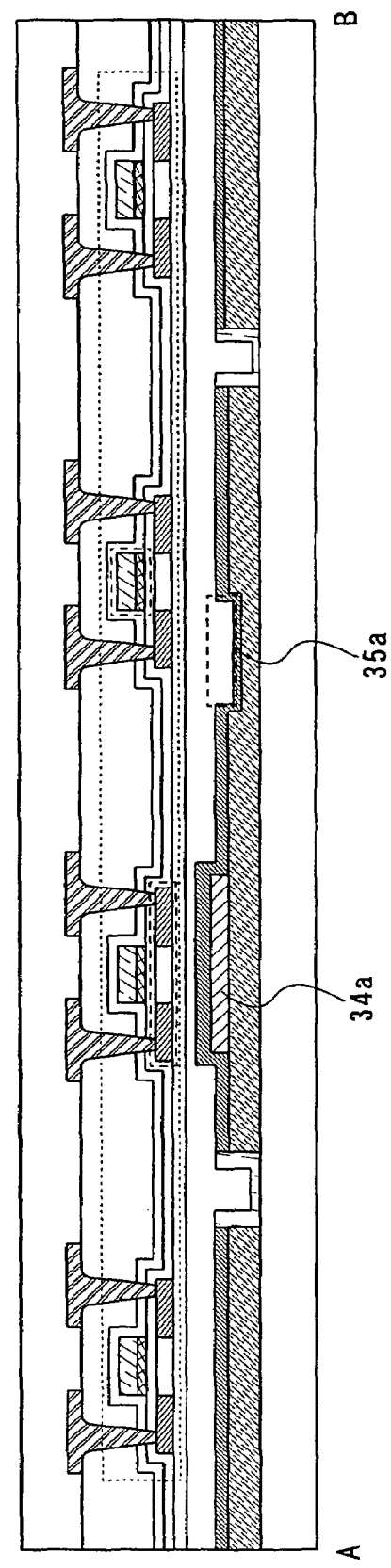

In FIGS. 9A and 9B, a region 33a including one semiconductor element group is formed. In the region 33a, in the light-transmitting substrate 11a, a pattern which can be read as "81" is formed in a mask. When the pattern is used as a die, a semiconductor device which has an element group with a pattern on its back side is manufactured.

First, the mask 13 which blocks light is formed over the light-transmitting substrate 11a. A substance for the mask 13 is not specifically limited and is acceptable as long as the substance can block the light 15 which is used in a following light exposure step. In addition, the mask 13 may be formed in a region which is peeled off in a following peeling step, that is, a region in which the stacked-layer body 31 is formed. A photolithography method is used here to form the mask 13, but a droplet discharging method may be used. The mask may be formed by direct drawing with a laser after a material of the mask 13 is deposited on an entire surface. Alternatively, a screen printing method is applicable. The mask 13 is preferably formed of a resist. The mask 13 may be formed of a resist by a spin coating method, a droplet discharging method, or the like.

Then, either or both a pattern layer (a projection) 34a and a pattern layer (a depression) 35a are formed over the mask 13 (see FIGS. 9A and 9B). By the pattern layer (the projection) 34a, a depression is formed on a back side of the semiconductor device which is manufactured. In addition, by the pattern layer (the depression) 35a, a projection is formed on the back side of the semiconductor device which is manufactured. A material of the pattern layer (the projection) 34a is not specifically limited, as long as the liquid repellent film 12 can be formed thereover in a following step.

Then, the liquid repellent film 12 is formed as a liquid repellent self-assembled monolayer over the light-transmitting substrate 11a and the mask 13 which blocks light as in Embodiment Mode 2. The liquid repellent film 12 may be formed using a silane coupling agent having a fluoroalkyl group (FAS). The substrate which is heated and FAS are confined so as to form a FAS self-assembled monolayer on a surface of the substrate by gas-phase reaction. Other than a silane coupling agent having a fluoroalkyl group, a substance having a structure in which hydrogen in an alkyl group is replaced by fluorine can be used. Although a substance having an alkyl group is water repellent, liquid repellency is needed in the present invention; therefore, the substance having a structure in which hydrogen in an alkyl group is replaced by fluorine is used here.

Next, the back surface of the light-transmitting substrate 11a on which the mask 13 is formed is light exposed using the light 15 emitted from the light source 14 as in Embodiment Mode 2. A region in which the mask 13 is formed is not exposed to the light. On the other hand, a region in which the mask 13 is not formed is exposed to the light and the liquid repellent film 12 therein is decomposed and a liquid repellent component therein is removed. Here, light in a wavelength range with which the light can pass through the light-transmitting substrate 11a is used as the light 15. The light 15 may have a wavelength of less than or equal to 200 nm. The region which is not exposed to the light is referred to as the first region 16, whereas the region which is exposed to the light is referred to as the second region 17 as in Embodiment Mode 2. Further, the periphery of the edge of the substrate is made to be non-liquid repellent, whereby the base film 18 which is formed in a following step can be formed uniformly.

The base film 18 is formed over the substrate, on which the first region 16 and the second region 17 are formed as in Embodiment Mode 2. The base film 18 is preferably formed of a material with high heat resistance. In addition, a precursor thereof, which is used for the base film 18, preferably has high viscosity. As such a material, for example, an organic resin such as an acrylic resin, an epoxy resin, or polyimide is used. In particular, polyimide is preferably used. Polyimide has heat resistance of greater than or equal to 300° C., which is comparatively high heat resistance. An organic film of any of these materials is formed to have a thickness of greater than or equal to 400 nm and less than or equal to 20 μm, more preferably, greater than or equal to 10 μm and less than or equal to 20 μm. If the base film 18 is formed thicker than the foregoing ranges of values, the semiconductor device itself becomes thicker, which is not preferable. On the other hand, if the base film 18 is formed thinner than the foregoing ranges of values, the element is easily damaged and the base film 18 is easily broken during or after a peeling step. Here, a solution of a precursor of polyimide is applied by a spin coating method and baked, whereby a polyimide film is formed. A polyimide film having a pattern reflecting a projection and a depression of the pattern layer (the projection) 34a and the pattern layer (the depression) 35a is formed. When seen from the back side of the semiconductor device, the pattern layer 34a (the projection) corresponds to a depression in the polyimide film, whereas the pattern layer 35a (the depression) corresponds to a projection in the polyimide film. In other words, a pattern mirror symmetric to "81" is formed on a back side of the formed element group.

A TFT is formed over the substrate, on which the liquid repellent film is formed in a desired region as described above, as in Embodiment Modes 1 to 3. A groove is formed using a laser or a scriber, or both of them, in the region 33a in which the TFT is formed. Then, peeling is conducted. In this manner, a semiconductor element group including TFTs formed by the stacked-layer body 31 can be manufactured.

In this embodiment mode, a case in which the photocatalyst film 32 is not formed as in Embodiment Mode 2 is described, but a pattern layer can be formed similarly to that in this embodiment mode, in a case where the photocatalyst film 32 is formed as in Embodiment Mode 3. Note that, when glass is used for the light-transmitting substrate 11a, a photocatalyst is formed and back surface light exposure is conducted with light having a wavelength of greater than or equal to 300 and less than or equal to 400 nm.

According to the present invention, the possibility that a TFT; and a peripheral element are influenced mechanically or electrostatically and damaged in a peeling step for transferring the TFT can be reduced.

In the present invention, a TFT is formed over a substrate having heat resistance; therefore, the TFT can be manufactured without specific restriction on apparatuses, conditions, and the like, compared with a case of manufacturing the TFT directly over a plastic substrate. Accordingly, the TFT can be manufactured as in a conventional case in which the TFT is formed over a plastic substrate through peeling and transferring steps.

Furthermore, by using the present invention, the semiconductor device itself can be thin compared with a conventional case in which a TFT is transferred to a plastic substrate.

Further, as described in this embodiment mode, a semiconductor device which has an element group with a desired pattern on its back side can be easily manufactured.

Embodiment Mode 7

A semiconductor device of the present invention including an element group which has a desired microfabrication pattern on its back side as in Embodiment Modes 5 and 6 is described with reference to FIGS. 10A and 10B. Note that the same layers are denoted by the same reference numerals in different embodiment modes.

Figure 10A:
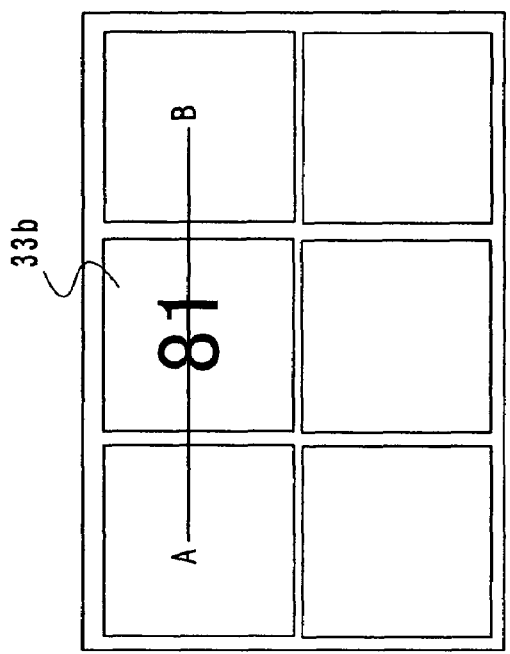
FIGS. 10A and 10B show a method of manufacturing a semiconductor device of the present invention.
Figure 10B:
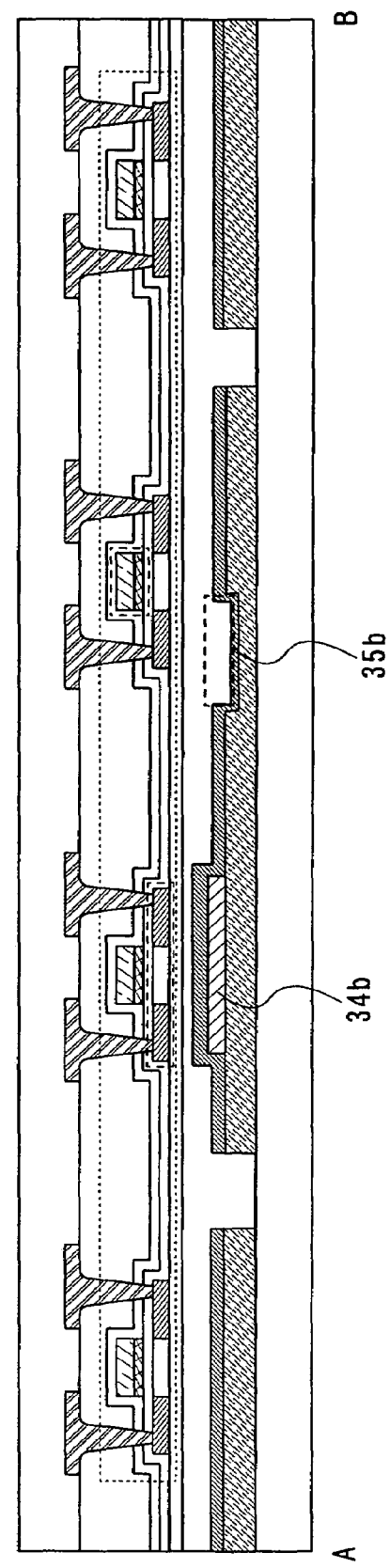

In FIGS. 10A and 10B a region 33b including one semiconductor element group is formed. In the region 33b, in the substrate 11, a pattern which can be read as "81" is formed in a mask. When the pattern is used as a die, a semiconductor device which has an element group with a pattern on its back side is manufactured.

First, the mask 13a is formed over the substrate 11 as in Embodiment Mode 4. The mask 13a may be formed in a region which is peeled off in a following peeling step, that is, a region in which the stacked-layer body 31 is formed. A photolithography method is used here to form the mask 13a, but a droplet discharging method may be used. The mask may be formed by direct drawing with a laser after a material of the mask 13a is deposited on an entire surface. Alternatively, a screen printing method is applicable. The mask 13a is acceptable, as long as the liquid repellent film 12a can be formed thereover in a following step. The mask 13a can be formed of gold (Au), silver (Ag), platinum (Pt), copper (Cu), palladium (Pd), rhodium (Rh), ruthenium (Ru), or an alloy containing any of these elements as its main component. Note that, in this embodiment mode, the mask 13a does not serve as a mask, but the mask 13a is referred to as a mask for comparison or the like with another embodiment mode and for convenience in description.

Then, either or both a pattern layer (a projection) 34b and a pattern layer (a depression) 35b are formed over the mask 13a (see FIGS. 10A and 10B). By the pattern layer (the projection) 34b, a depression is formed on a back side of the semiconductor device which is manufactured. In addition, by the pattern layer (the depression) 35b, a projection is formed on the back side of the semiconductor device which is manufactured. A material of the pattern layer (the projection) 34b is not specifically limited, as long as the liquid repellent film 12a can be formed thereover in a following step.

Then, the liquid repellent film 12a is formed as a liquid repellent self-assembled monolayer over the substrate 11 and the mask 13a over which a pattern layer is formed as in Embodiment Mode 4. The mask 13a and the pattern layer (the projection) 34b may be formed of gold (Au), silver (Ag), platinum (Pt), copper (Cu), palladium (Pd), rhodium (Rh), ruthenium (Ru), or an alloy containing any of these elements as its main component. The liquid repellent film 12a may be formed using a chemical solution containing a mercapto group such as thiol or mercaptan. Fluoroalkyl thiol may be dissolved in an organic solvent to form a solution with a concentration of approximately 1 mmol/l (1 mM), and the substrate 11 provided with the mask 13a may be soaked therein, whereby the liquid repellent film 12a is formed. Since the substrate 11 is formed of a material on which the liquid repellent film 12a cannot be formed, the liquid repellent film 12a is formed only in a region in which the mask 13a is formed over the substrate 11.

Then, the base film 18 is formed over the substrate 11 and the liquid repellent film 12a as in Embodiment Mode 4. The base film 18 is preferably formed of a material with high heat resistance. In addition, a precursor thereof, which is used for the base film 18, preferably has high viscosity. As such a material, for example, an organic resin such as an acrylic resin, an epoxy resin, or polyimide is used. In particular, polyimide is preferably used. Polyimide has heat resistance of greater than or equal to 300° C., which is comparatively high heat resistance. An organic film of any of these materials is formed to have a thickness of greater than or equal to 400 nm and less than or equal to 20 μm, more preferably, greater than or equal to 10 μm and less than or equal to 20 μm. If the base film 18 is formed thicker than the foregoing ranges of values, the semiconductor device itself becomes thicker, which is not preferable. On the other hand, if the base film 18 is formed thinner than the foregoing ranges of values, the element is easily damaged and the base film 18 is easily broken during or after a peeling step. Here, a solution of a precursor of polyimide is applied by a spin coating method and baked, whereby a polyimide film is formed.

A TFT is formed over the substrate, on which the liquid repellent film 12a is formed in a desired region as described above, as in Embodiment Mode 1. A groove is formed using a laser or a scriber, or both of them, in a periphery of an edge of a region in which the TFTs are formed. Then, peeling is conducted. In this manner, an element group including TFTs formed by the stacked-layer body 31 can be manufactured.

According to the present invention, the possibility that a TFT and a peripheral element are influenced mechanically or electrostatically and damaged in a peeling step for transferring the TFT can be reduced.

In the present invention, a TFT is formed over a substrate having heat resistance; therefore, the TFT can be manufactured without specific restriction on apparatuses, conditions, and the like, compared with a case of manufacturing the TFT directly over a plastic substrate. Accordingly, the TFT can be manufactured as in a conventional case in which the TFT is formed over a plastic substrate through peeling and transferring steps.

Furthermore, by using the present invention, the semiconductor device itself can be thin compared with a conventional case in which a TFT is transferred to a plastic substrate.

Further, as described in this embodiment mode, a semiconductor device which has an element group with a desired pattern on its back side can be easily manufactured.

Embodiment Mode 8

Figure 11:
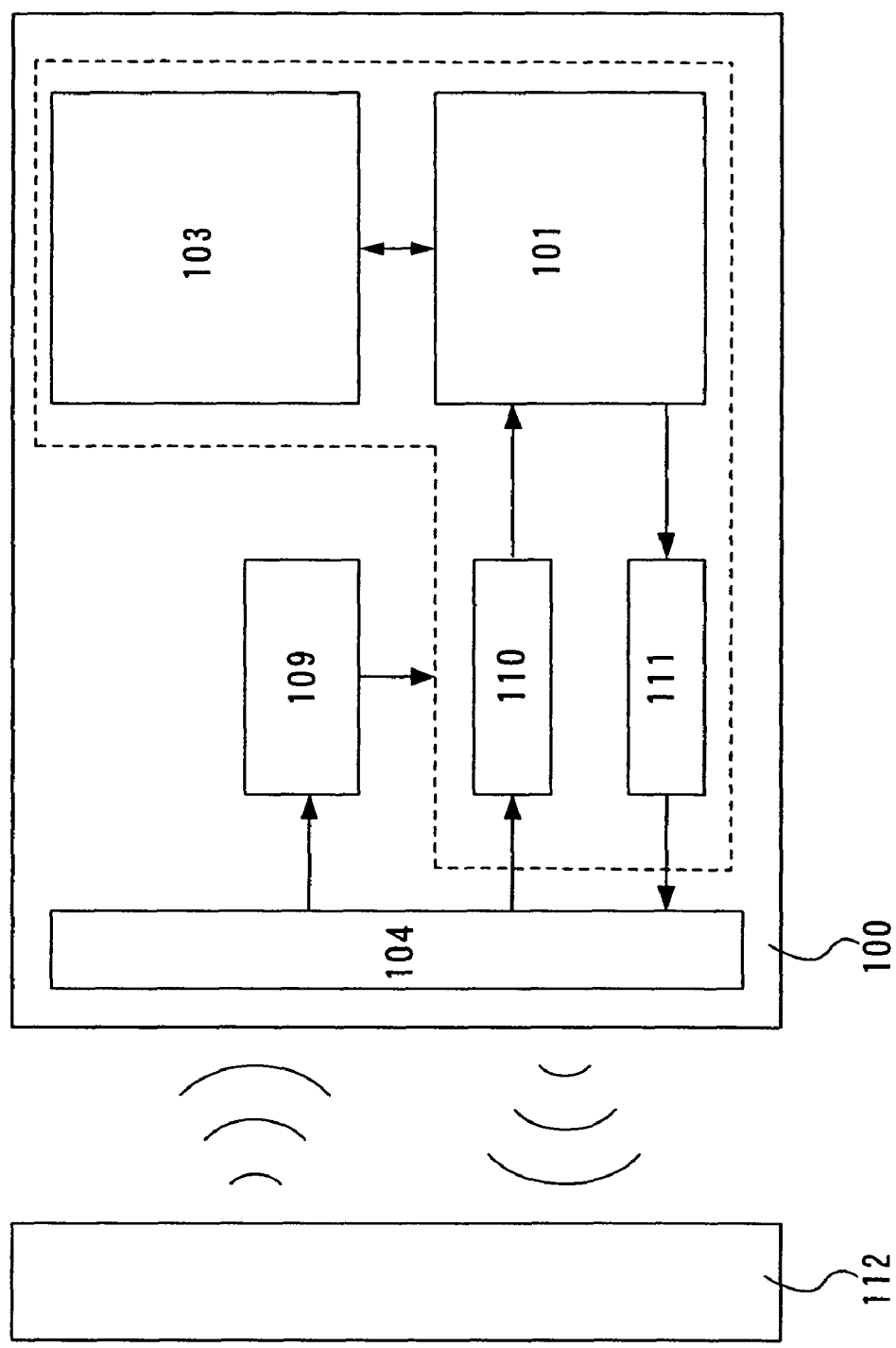
FIG. 11 illustrates a structure of a semiconductor device of the present invention.

An example of a structure of a semiconductor device of the present invention is described with reference to FIG. 11. A semiconductor device 100 of the present invention has an arithmetic processing circuit 101, a memory circuit 103, an antenna 104, a power source circuit 109, a demodulation circuit 110, and a modulation circuit 111. The antenna 104 and the power source circuit 109 are essential component parts of the semiconductor device 100, and the other parts are appropriately provided in accordance with the use of the semiconductor device 100.

The arithmetic processing circuit 101 analyzes an order, controls the memory circuit 103, outputs data which is transmitted to an exterior portion to the modulation circuit 111, and the like, on the basis of a signal which is inputted from the demodulation circuit 110.

The memory circuit 103 has a circuit including a memory element and a control circuit which writes and reads data. The memory circuit 103 stores at least an identification number of the semiconductor device itself. The semiconductor device is distinguished from another semiconductor device by the identification number. In addition, the memory circuit 103 has one or a plurality of an organic memory, a DRAM (Dynamic Random Access Memory), a SRAM (Static Random Access Memory), an FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), and a flash memory. The organic memory has a structure in which a layer containing an organic compound is interposed between a pair of conductive layers. The organic memory has a simple structure, and therefore, has at least two advantages. One advantage is that a manufacturing process can be simplified and the cost can be reduced. The other advantage is that an area of a stacked-layer body can be easily reduced and an organic memory with large capacity can be easily realized. Further, since an organic memory is a nonvolatile memory, a battery may or may not be incorporated. Accordingly, it is preferable to use an organic memory as the memory circuit 103.

The antenna 104 converts a carrier wave which is supplied from a reader/writer 112 into an AC electrical signal. In addition, load modulation is applied by the modulation circuit 111. The power source circuit 109 generates a power source voltage by using the AC electric signal converted by the antenna 104 and supplies the power source voltage to the circuits.

The demodulation circuit 110 demodulates the AC electric signal converted by the antenna 104 and supplies the demodulated signal to the arithmetic processing circuit 101. The modulating circuit 111 applies load modulation to the antenna 104 based on the signal supplied from the arithmetic processing circuit 101.

The reader/writer 112 receives the load modulation applied to the antenna 104 as a carrier wave. The reader/writer 112 transmits the carrier wave to the semiconductor device 100. Note that the carrier wave refers to an electromagnetic wave received or transmitted by the reader/writer 112, and the reader/writer 112 receives the carrier wave which is modulated by the modulating circuit 111.

A semiconductor device of the present invention having a function of transmitting and receiving electromagnetic waves wirelessly, which is described above, is referred to as an RFID (Radio Frequency Identification) tag, an RF chip, an RF tag, an IC chip, an IC tag, an IC label, a wireless chip, a wireless tag, an electronic chip, an electronic tag, a wireless processor, or a wireless memory. This embodiment mode can be freely combined with another embodiment mode.

By using the present invention, in manufacturing a semiconductor device capable of wireless communication typified by an RFID tag as described in this embodiment mode, a highly reliable semiconductor device which is thinner than a conventional one can be manufactured with high yield with a small number of steps.

Embodiment Mode 9

Figure 12A:
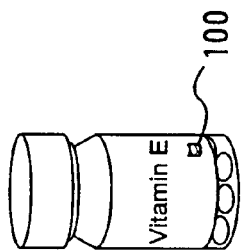
FIGS. 12A to 12F illustrate goods each using a semiconductor device of the present invention.
Figure 12E:
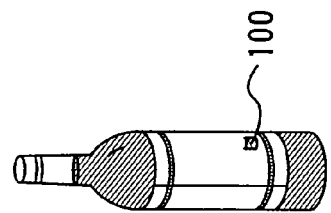
Figure 12C:
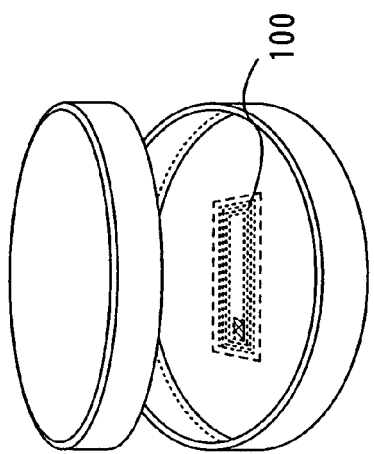
Figure 12F:
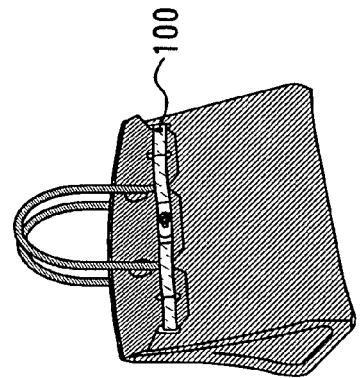
Figure 12B:
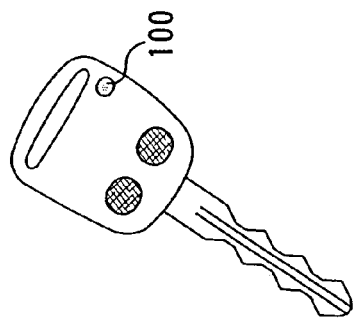
Figure 12D:
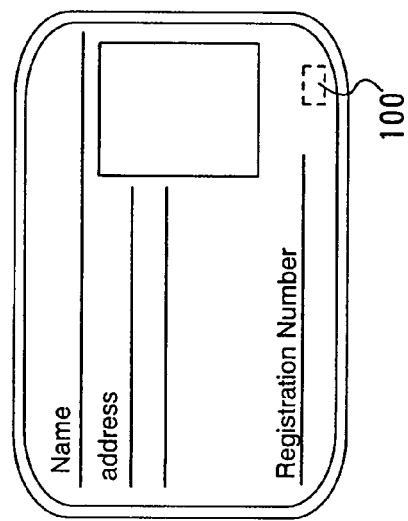
Figure 13A:
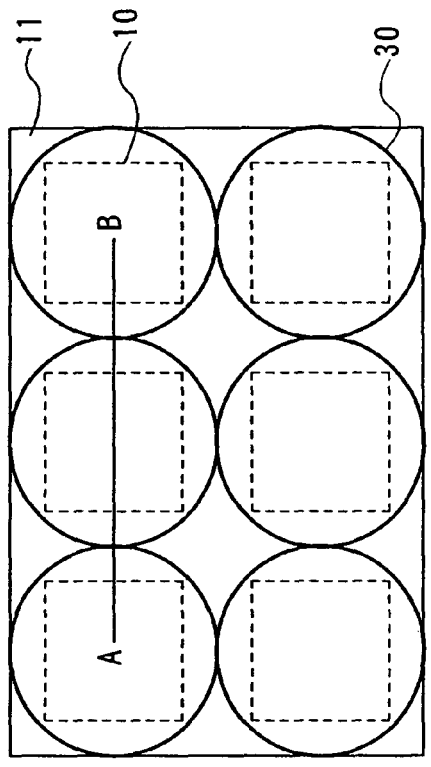
FIGS. 13A to 13D each illustrates a shape of a semiconductor device of the present invention.
Figure 13B:
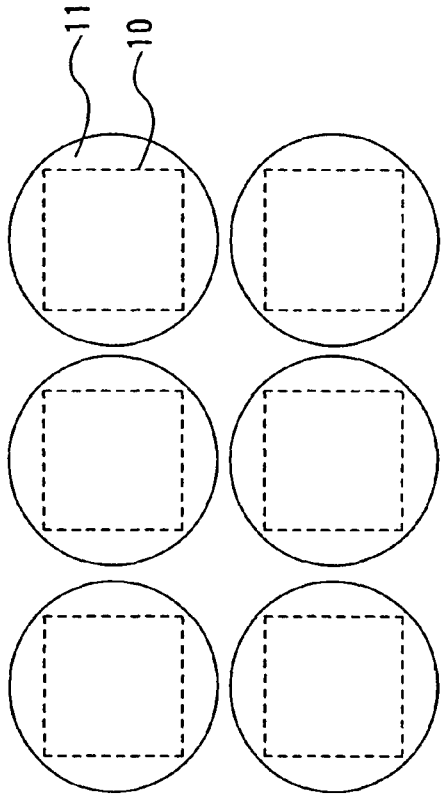
Figure 13C:
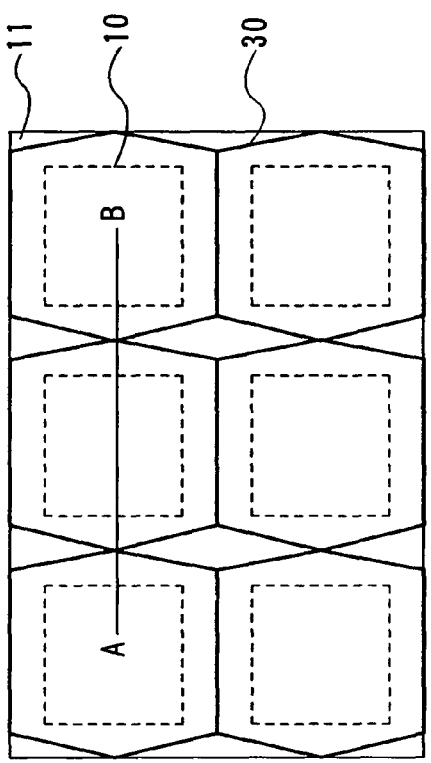
Figure 13D:
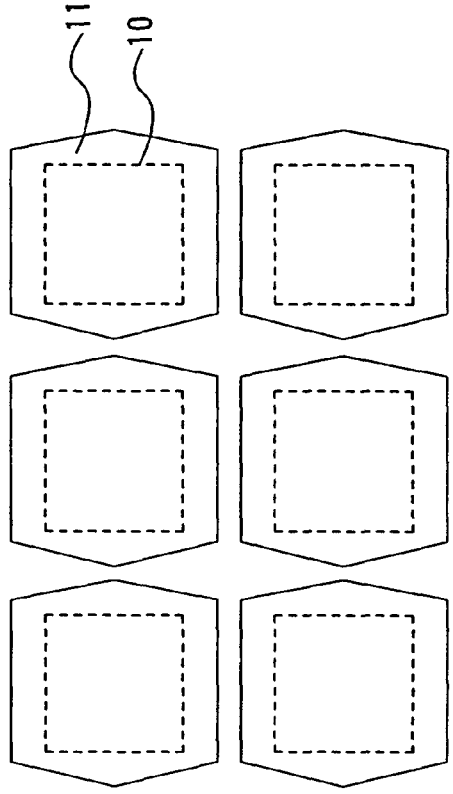

The semiconductor device 100, to which the present invention is applied, can transmit and receive electromagnetic waves and be used in various objects and various systems by utilizing the function. The objects include, for example, keys (see FIG. 12A), banknotes, coins, securities, bearer bonds, certificates (a driver's license, a resident's card, and the like; see FIG. 12B), books, packing containers (a petri dish and the like; see FIG. 12C), packing and wrapping containers (wrapping paper, a bottle, and the like; see FIGS. 12E and 12F), recording media (a disk, a video tape, and the like), vehicles (a bicycle and the like), accessories (a bag, glasses, and the like; see FIG. 12D), foods, clothing, everyday articles, and electronic devices (a liquid crystal display device, an EL display device, a television device, a portable terminal, and the like). A semiconductor device of the present invention is fixed by being attached to a surface of the objects having various forms as described above, or being embedded into the objects. In addition, the systems include an inventory management system, a certification system, a distribution system, and the like. By utilizing a semiconductor device of the present invention, high-function, multifunction, and a high-added value of the systems can be achieved. This embodiment mode can be freely combined with another embodiment mode.

This application is based on Japanese Patent Application serial No. 2006-182779 filed in Japan Patent Office on Jun. 30, 2006, the entire contents of which are hereby incorporated by reference.

What is claimed is:

1. A method of manufacturing a semiconductor device, comprising:
    forming a first region in which a liquid repellent film is formed and a second region in which the liquid repellent film is not formed, over a substrate;
    forming a base film over the first region and the second region;
    forming a layer including a semiconductor element group over the base film wherein the semiconductor element group includes thin film transistors and overlaps with the first region;
    forming a groove in the layer so as to surround the semiconductor element group;
    peeling off a region of the layer surrounded by the groove from the substrate; and
    forming a pattern over the substrate before forming the first region and the second region.

2. The method of manufacturing a semiconductor device according to claim 1, wherein the liquid repellent film is formed of a silane coupling agent having a fluoroalkyl group.

3. The method of manufacturing a semiconductor device according to claim 1, wherein the substrate is any one of a glass substrate, a quartz substrate, a silicon substrate, an aluminum oxide substrate, or a titanium oxide substrate.

4. The method of manufacturing a semiconductor device according to claim 1, wherein the base film comprises an insulating organic substance.

5. The method of manufacturing a semiconductor device according to claim 1, wherein the base film includes one or a plurality of elements selected from the group consisting of an epoxy resin, an acrylic resin, and polyimide as a main component.

6. The method of manufacturing a semiconductor device according to claim 1, wherein the base film comprises an insulating inorganic substance.

7. The method of manufacturing a semiconductor device according to claim 1, wherein laser light is used for forming the groove.

8. The method of manufacturing a semiconductor device according to claim 1, wherein a temperature of the substrate is maintained at a temperature 300° C. or less after the formation of the base film.

9. The method of manufacturing a semiconductor device according to claim 1, wherein the substrate has heat resistance.

10. A method of manufacturing a semiconductor device, comprising:
forming a liquid repellent film over a substrate;
forming a mask in a first region over the liquid repellent film;
forming a second region by exposing a region in which the mask is not formed to light;
removing the mask;
forming a base film over the first region and the second region;
forming a layer including a semiconductor element group over the base film wherein the semiconductor element group includes thin film transistors and overlaps with the first region;
forming a groove in the layer so as to surround the semiconductor element group;
peeling off a region of the layer surrounded by the groove from the substrate; and
forming a pattern over the substrate before forming the liquid repellent film.

11. The method of manufacturing a semiconductor device according to claim 10, wherein the liquid repellent film is formed of a silane coupling agent having a fluoroalkyl group.

12. The method of manufacturing a semiconductor device according to claim 10, wherein the substrate is any one of a glass substrate, a quartz substrate, a silicon substrate, an aluminum oxide substrate, or a titanium oxide substrate.

13. The method of manufacturing a semiconductor device according to claim 10, wherein the base film comprises an insulating organic substance.

14. The method of manufacturing a semiconductor device according to claim 10, wherein the base film includes one or a plurality of elements selected from the group consisting of an epoxy resin, an acrylic resin, and polyimide as a main component.

15. The method of manufacturing a semiconductor device according to claim 10, wherein the base film comprises an insulating inorganic substance.

16. The method of manufacturing a semiconductor device according to claim 10, wherein laser light is used for forming the groove.

17. The method of manufacturing a semiconductor device according to claim 10, wherein a temperature of the substrate is maintained at a temperature 300° C. or less after the formation of the base film.

18. The method of manufacturing a semiconductor device according to claim 10, wherein the substrate has heat resistance.

19. A method of manufacturing a semiconductor device, comprising:
forming a mask selectively over a substrate, the substrate being a light-transmitting substrate;
forming a first region by forming a liquid repellent film over the substrate and the mask;
forming a second region by exposing a region in which the mask is not formed to light from a back surface of the substrate;
forming a base film over the first region and the second region;
forming a layer including a semiconductor element group over the base film wherein the semiconductor element group includes thin film transistors and overlaps with the first region;
forming a groove in the layer so as to surround the semiconductor element group;
peeling off a region of the layer surrounded by the groove from the substrate; and
forming a pattern over the mask before forming the first region by forming the liquid repellent film.

20. The method of manufacturing a semiconductor device according to claim 19, wherein the liquid repellent film is formed of a silane coupling agent having a fluoroalkyl group.

21. The method of manufacturing a semiconductor device according to claim 19, wherein the substrate is a glass substrate or a quartz substrate.

22. The method of manufacturing a semiconductor device according to claim 19, wherein the base film comprises an insulating organic substance.

23. The method of manufacturing a semiconductor device according to claim 19, wherein the base film includes one or a plurality of elements selected from the group consisting of an epoxy resin, an acrylic resin, and polyimide as a main component.

24. The method of manufacturing a semiconductor device according to claim 19, wherein the base film comprises an insulating inorganic substance.

25. The method of manufacturing a semiconductor device according to claim 19, wherein laser light is used for forming the groove.

26. The method of manufacturing a semiconductor device according to claim 19, wherein a temperature of the substrate is maintained at a temperature 300° C. or less after the formation of the base film.

27. The method of manufacturing a semiconductor device according to claim 19, wherein the substrate has heat resistance.

28. A method of manufacturing a semiconductor device, comprising:
forming a mask selectively over a substrate, the substrate being a light-transmitting substrate;
forming a film having a photocatalytic substance over the substrate and the mask;
forming a first region by forming a liquid repellent film over the film having the photocatalytic substance;
forming a second region by exposing a region in which the mask is not formed to light from a back surface of the substrate;
forming a base film over the first region and the second region;
forming a layer including a semiconductor element group over the base film wherein the semiconductor element group includes thin film transistors and overlaps with the first region;
forming a groove in the layer so as to surround the semiconductor element group;
peeling off a region of the layer surrounded by the groove from the substrate; and
forming a pattern over the mask before forming the film having the photocatalytic substance.

29. The method of manufacturing a semiconductor device according to claim 28, wherein the liquid repellent film is formed of a silane coupling agent having a fluoroalkyl group.

30. The method of manufacturing a semiconductor device according to claim 28, wherein the substrate is a glass substrate or a quartz substrate.

31. The method of manufacturing a semiconductor device according to claim 28, wherein the film having the photocatalytic substance comprises titanium oxide.

32. The method of manufacturing a semiconductor device according to claim 28, wherein the base film comprises an insulating organic substance.

33. The method of manufacturing a semiconductor device according to claim 28, wherein the base film includes one or a plurality of elements selected from the group consisting of an epoxy resin, an acrylic resin, and polyimide as a main component.

34. The method of manufacturing a semiconductor device according to claim 28, wherein the base film comprises an insulating inorganic substance.

35. The method of manufacturing a semiconductor device according to claim 28, wherein laser light is used for forming the groove.

36. The method of manufacturing a semiconductor device according to claim 28, wherein a temperature of the substrate is maintained at a temperature 300° C. or less after the formation of the base film.

37. The method of manufacturing a semiconductor device according to claim 28, wherein the substrate has heat resistance.

38. A method of manufacturing a semiconductor device, comprising:
   forming a mask selectively over a substrate, the substrate being a light-transmitting substrate;
   forming a first region by forming a liquid repellent film over the substrate and the mask;
   forming a film having a photocatalytic substance over the liquid repellent film;
   forming a second region by exposing a region in which the mask is not formed to light from a back surface of the substrate;
   forming a base film over the first region and the second region;
   forming a layer including a semiconductor element group over the base film wherein the semiconductor element group includes thin film transistors and overlaps with the first region;
   forming a groove in the layer so as to surround the semiconductor element group;
   peeling off a region in the layer surrounded by the groove from the substrate; and
   forming a pattern over the mask before forming the first region by forming the liquid repellent film.

39. The method of manufacturing a semiconductor device according to claim 38, wherein the liquid repellent film is formed of a silane coupling agent having a fluoroalkyl group.

40. The method of manufacturing a semiconductor device according to claim 38, wherein the substrate is a glass substrate or a quartz substrate.

41. The method of manufacturing a semiconductor device according to claim 38, wherein the film having the photocatalytic substance comprises titanium oxide.

42. The method of manufacturing a semiconductor device according to claim 38, wherein the base film comprises an insulating organic substance.

43. The method of manufacturing a semiconductor device according to claim 38, wherein the base film includes one or a plurality of elements selected from the group consisting of an epoxy resin, an acrylic resin, and polyimide as a main component.

44. The method of manufacturing a semiconductor device according to claim 38, wherein the base film comprises an insulating inorganic substance.

45. The method of manufacturing a semiconductor device according to claim 38, wherein laser light is used for forming the groove.

46. The method of manufacturing a semiconductor device according to claim 38, wherein a temperature of the substrate is maintained at a temperature of 300° C. or less after the formation of the base film.

47. The method of manufacturing a semiconductor device according to claim 38, wherein the substrate has heat resistance.

48. A method of manufacturing a semiconductor device, comprising:
   forming a mask selectively over a substrate;
   forming a first region in which a liquid repellent film is formed and a second region in which the liquid repellent film is not formed, over the mask;
   forming a base film over the first region and the second region;
   forming a layer including a semiconductor element group over the base film wherein the semiconductor element group includes thin film transistors and overlaps with the first region;
   forming a groove in the layer so as to surround the semiconductor element group;
   peeling off a region in the layer surrounded by the groove from the substrate; and
   forming a pattern over the mask before forming the liquid repellent film.

49. The method of manufacturing a semiconductor device according to claim 48, wherein a chemical solution containing a mercapto group is used for the liquid repellent film.

50. The method of manufacturing a semiconductor device according to claim 48, wherein the mask includes one or a plurality of elements selected from the group consisting of gold, silver, platinum, copper, palladium, rhodium, and ruthenium as a main component.

51. The method of manufacturing a semiconductor device according to claim 48, wherein the substrate is any one of a glass substrate, a quartz substrate, a silicon substrate, an aluminum oxide substrate, or a titanium oxide substrate.

52. The method of manufacturing a semiconductor device according to claim 48, wherein the base film comprises an insulating organic substance.

53. The method of manufacturing a semiconductor device according to claim 48, wherein the base film includes one or a plurality of elements selected from the group consisting of an epoxy resin, an acrylic resin, and polyimide as a main component.

54. The method of manufacturing a semiconductor device according to claim 48, wherein the base film comprises an insulating inorganic substance.

55. The method of manufacturing a semiconductor device according to claim 48, wherein laser light is used for forming the groove.

56. The method of manufacturing a semiconductor device according to claim 48, wherein a temperature of the substrate is maintained at a temperature 300° C. or less after the formation of the base film.

57. The method of manufacturing a semiconductor device according to claim 48, wherein the substrate has heat resistance.

* * * * *